(12) United States Patent
Fripp et al.

(10) Patent No.: US 10,439,127 B2
(45) Date of Patent: Oct. 8, 2019

(54) BENDER BAR TRANSDUCER HAVING STACKED ENCAPSULATED ACTUATORS

(71) Applicant: Halliburton Energy Services, Inc., Houston, TX (US)

(72) Inventors: Michael L. Fripp, Carrollton, TX (US); Paul G. Junghans, Houston, TX (US); Chen Li, Katy, TX (US); Batakrishna Mandal, Missouri City, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 568 days.

(21) Appl. No.: 14/888,194

(22) PCT Filed: Feb. 12, 2014

(86) PCT No.: PCT/US2014/016102
§ 371 (c)(1),
(2) Date: Oct. 30, 2015

(87) PCT Pub. No.: WO2015/122888
PCT Pub. Date: Aug. 20, 2015

(65) Prior Publication Data
US 2016/0072040 A1 Mar. 10, 2016

(51) Int. Cl.
*H01L 41/09* (2006.01)
*E21B 47/10* (2012.01)
(Continued)

(52) U.S. Cl.
CPC .......... *H01L 41/098* (2013.01); *B06B 1/0215* (2013.01); *B06B 1/0603* (2013.01); *B06B 1/0614* (2013.01); *E21B 47/101* (2013.01); *E21B 47/14* (2013.01); *H01L 41/0533* (2013.01); *H01L 41/083* (2013.01); *H01L 41/0833* (2013.01); *H01L 41/0933* (2013.01); *H01L 41/27* (2013.01); *G01V 1/40* (2013.01); *G01V 2001/526* (2013.01)

(58) Field of Classification Search
CPC .. G01V 1/40; G01V 2001/526; H01L 41/098; H01L 41/27; H01L 41/0833; H01L 41/0533; H01L 41/083; H01L 41/0933; E21B 47/14; E21B 47/101; B06B 1/0603; B06B 1/0215; B06B 1/0614
See application file for complete search history.

(56) References Cited

U.S. PATENT DOCUMENTS

| 3,287,692 A | 12/1957 | Turner |
| 3,497,731 A | 9/1967 | Straube |

(Continued)

FOREIGN PATENT DOCUMENTS

WO    WO 2012/034071 A1    3/2012

OTHER PUBLICATIONS

International Search Report and the Written Opinion of the International Searching Authority, or the Declaration, dated Jul. 9, 2014, PCT/US2014/016102, 11 pages, ISA/US.

*Primary Examiner* — Justin Seo
*Assistant Examiner* — John M Royston
(74) *Attorney, Agent, or Firm* — Haynes and Boone, LLP

(57) ABSTRACT

A bender bar transducer having stacked encapsulated actuators provides improved acoustic power over a wider frequency range, low applied voltage requirements and consistent part-to-part performance.

20 Claims, 23 Drawing Sheets

(51) Int. Cl.
*H01L 41/083* (2006.01)
*B06B 1/02* (2006.01)
*B06B 1/06* (2006.01)
*E21B 47/14* (2006.01)
*H01L 41/053* (2006.01)
*H01L 41/27* (2013.01)
*G01V 1/40* (2006.01)
*G01V 1/52* (2006.01)

(56) References Cited

U.S. PATENT DOCUMENTS

| | | |
|---|---|---|
| 4,047,060 A | 9/1977 | Schafft |
| 4,499,556 A | 2/1985 | Abbott |
| 4,499,566 A * | 2/1985 | Abbott ................ B06B 1/0611 310/337 |
| 4,899,844 A * | 2/1990 | Katahara ............... G01V 1/005 181/106 |
| 5,367,500 A | 11/1994 | Ng |
| 5,473,214 A | 12/1995 | Hildebrand |
| 5,834,879 A | 11/1998 | Watanabe et al. |
| 6,744,181 B1 | 6/2004 | Ogiura et al. |
| 7,015,624 B1 | 3/2006 | Su et al. |
| 7,559,128 B2 | 7/2009 | Kitagawa et al. |
| 2004/0257912 A1 | 12/2004 | Dubinsky et al. |
| 2006/0214213 A1* | 9/2006 | Bariecki ............... H01G 4/005 257/310 |
| 2007/0062025 A1* | 3/2007 | Goat .................... H01L 41/257 29/594 |
| 2009/0154053 A1 | 6/2009 | Biggs et al. |
| 2012/0037423 A1* | 2/2012 | Geerits ................. E21B 47/00 175/50 |
| 2013/0023063 A1* | 1/2013 | Matsushima ............ G01J 5/34 438/3 |
| 2013/0205888 A1* | 8/2013 | Teowee ................. E21B 47/06 73/152.46 |

* cited by examiner

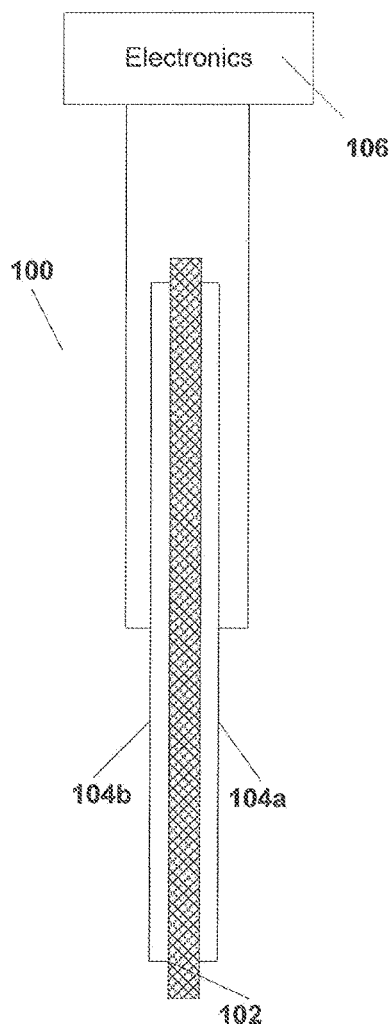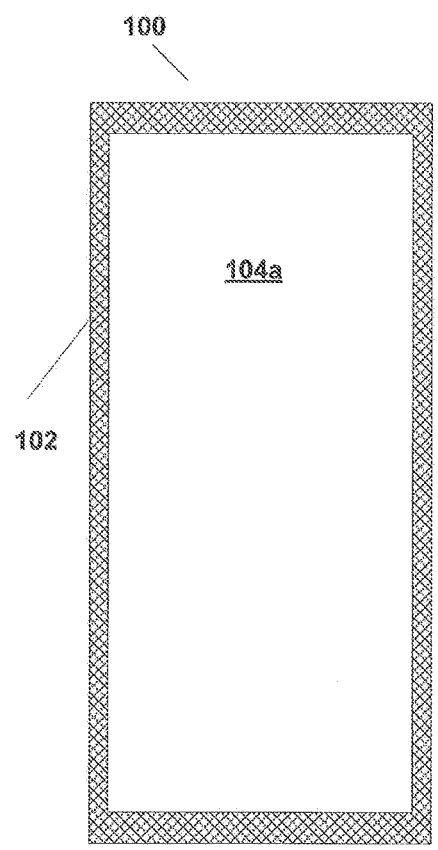
Figure 1A                    Figure 1B

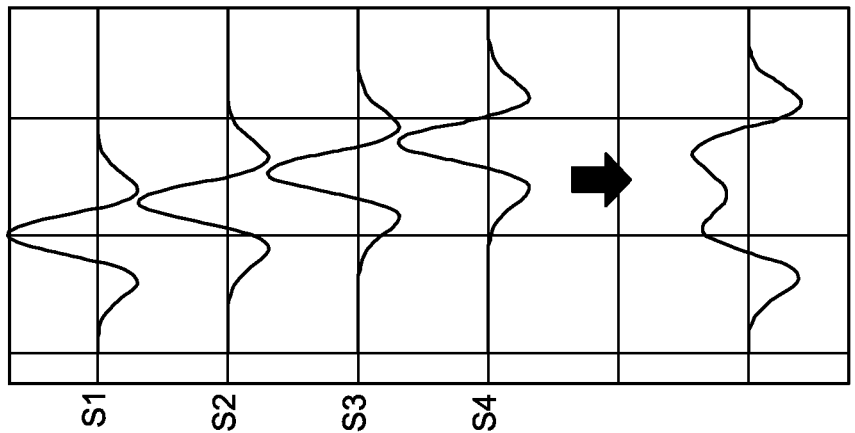
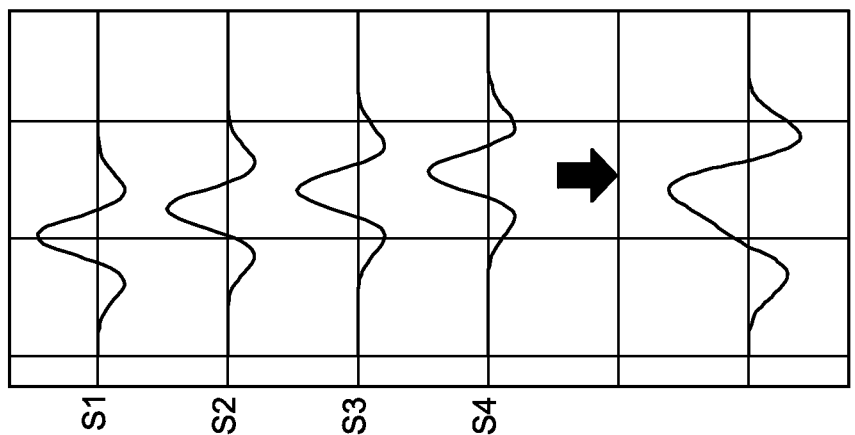
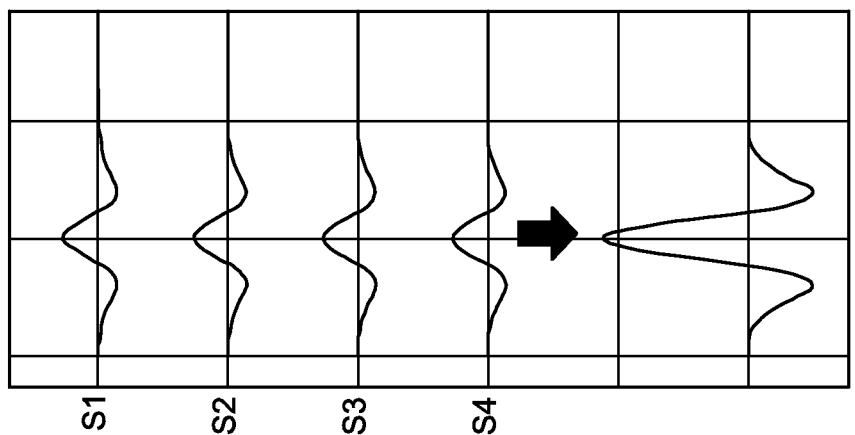

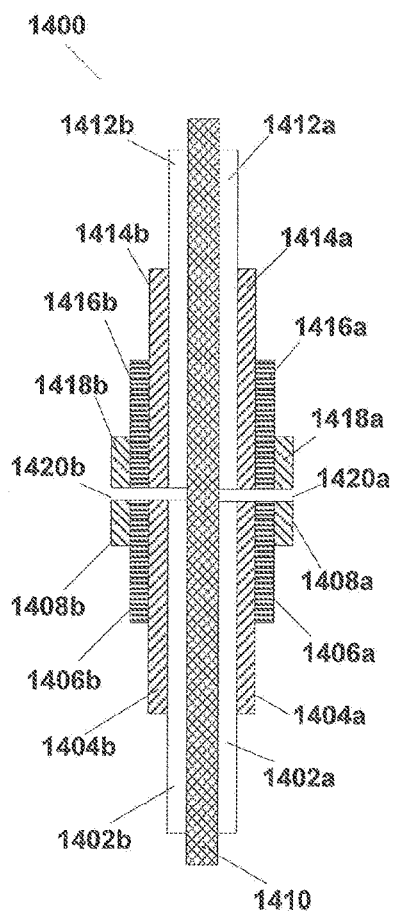
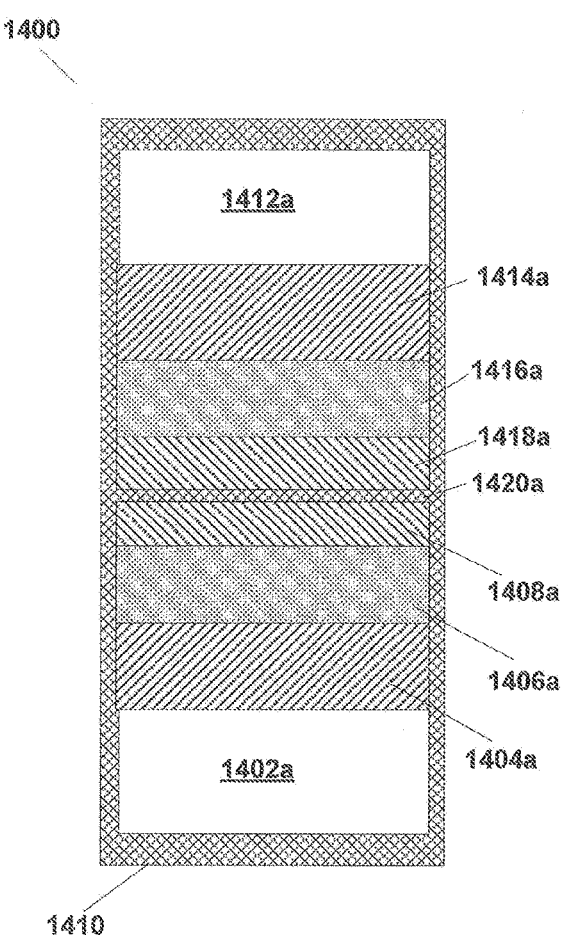
Figure 14A
Figure 14B

BENDER BAR TRANSDUCER HAVING STACKED ENCAPSULATED ACTUATORS

PRIORITY

The present application is a U.S. National Stage patent application of International Patent Application No. PCT/US2014/016102, filed on Feb. 12, 2014, the benefit of which is claimed and the disclosure of which is incorporated herein by reference in its entirety.

FIELD OF THE DISCLOSURE

The present disclosure relates generally to acoustic transducers and, more specifically, to an acoustic logging tool utilizing stacked encapsulated actuators to produce acoustic radiation.

BACKGROUND

Acoustic well logging is a well-developed art, and details of acoustic logging tools and techniques are set forth in A. Kurkjian, et al., "Slowness Estimation from Sonic Logging Waveforms", Geoexploration, Vol. 277, pp. 215-256 (1991); C. F. Morris et al., "A New Sonic Array Tool for Full Waveform Logging," SPE-13285, Society of Petroleum Engineers (1984); A. R. Harrison et al., "Acquisition and Analysis of Sonic Waveforms From a Borehole Monopole and Dipole Source . . . " SPE 20557, pp. 267-282 (September 1990); and C. V. Kimball and T. L. Marzetta, "Semblance Processing of Borehole Acoustic Array Data", Geophysics, Vol. 49, pp. 274-281 (March 1984). An example of an acoustic logging tool is provided in U.S. Pat. No. 6,661,737 entitled "ACOUSTIC LOGGING TOOL HAVING PROGRAMMABLE SOURCE WAVEFORMS," owned by the Assignee of the present disclosure, Halliburton Energy Services, Inc. of Houston, Tex.

An acoustic logging tool typically includes an acoustic source (transducer), and a set of receivers (the receiver array) that are spaced several inches or feet apart. An acoustic signal is transmitted by the acoustic source and received at the receivers of the borehole tool which are spaced apart from the acoustic source. Measurements are repeated every few inches as the tool passes along the borehole. The acoustic signal from the source travels through the formation adjacent the borehole to the receiver array, and the arrival times and perhaps other characteristics of the receiver responses are recorded.

Typically, compressional wave ("P-wave"), shear wave ("S-wave"), and Stoneley wave arrivals and waveforms are detected by the receivers and are processed. The processing of the data is often performed on the surface, although it may also be performed real time in the tool itself. Regardless, the information that is recorded is typically used to determine formation characteristics, such as formation slowness (the inverse of acoustic speed) and anisotropy, from which pore pressure, porosity, and other formation property determinations can be made. With some tools, the acoustic signals have been used to image the formation.

Acoustic logging tools are used for both wireline logging and logging while drilling applications. In wireline logging, a probe, or "sonde", housing multiple logging tools is lowered into the borehole after some or all of the well has been drilled. The sonde is attached to a conductive wireline that carries power from the surface to the tools in the sonde, and that carries telemetry information to the surface. The sonde may be transported through the borehole by the wireline, or a separate transport mechanism may be provided. For example, in "pipe-conveyed" logging, the sonde is mounted on a tubing string. The rigidity of the tubing string allows the sonde to be transported through highly deviated and horizontal boreholes.

One problem with obtaining downhole measurements via wireline is that the drilling assembly must be removed or "tripped" from the drilled borehole before the desired borehole information can be obtained. This can be both time-consuming and extremely costly, especially in situations where a substantial portion of the well has been drilled. In this situation, thousands of feet of tubing may need to be removed and stacked on the platform (if offshore). Typically, drilling rigs are rented by the day at a substantial cost. Consequently, the cost of drilling a well is directly proportional to the time required to complete the drilling process. Removing thousands of feet of tubing to insert a wireline logging tool can be an expensive proposition.

As a result, there is a strong incentive to minimize the number of wireline logging trips. One way to do this involves collection of data during the drilling process. Designs for measuring conditions downhole, including the movement and location of the drilling assembly contemporaneously with the drilling of the well, have come to be known as "measurement-while-drilling" techniques, or "MWD". Similar techniques, concentrating more on the measurement of formation parameters, commonly have been referred to as "logging while drilling" techniques, or "LWD". While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

LWD tools are generally located as close to the drill bit as possible, so as to minimize the delay between reaching a formation and measuring its properties. When implemented as LWD tools, acoustic logging tools must overcome a number of obstacles to perform successfully. These obstacles include drilling noise, and acoustic properties of the thick tool body.

Bender bars are utilized in acoustic logging tools to detect and/or generate acoustic vibrations or seismic waves. Bender bars can be utilized in both the transmitter portion and the receiver portion of the acoustic logging tool. However, current bender bars can have difficulties with low frequency responses, resulting in difficulties in producing high quality logs for large hole and soft formation applications. Additionally, traditional bender bars have been constructed with an actuator that is a single layer thick to allow for simpler construction. However, the single-layer design also requires the use of higher actuation voltages.

Accordingly, there is a need in the art for an improved bender bar that overcomes these and other limitations.

BRIEF DESCRIPTION OF THE DRAWINGS

FIGS. 1A and 1B illustrate a basic bender bar;

FIGS. 4A, 4B, and 4C illustrate the results of driving the bipolar elements of an illustrative stacked bender bar under different impulse characteristics;

FIGS. 14A, 14B, 14C, and 14D illustrate a stacked bender bar according to certain illustrative embodiments of the present disclosure;

DESCRIPTION OF ILLUSTRATIVE EMBODIMENTS

Illustrative embodiments and related methodologies of the present disclosure are described below as they might be employed in a bender bar having improved construction, operation and control. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

FIGS. 1A and 1B illustrate a bender bar transducer 100. As shown in the cross-sectional view of FIG. 1A, transducer 100 includes ferroelectric elements 104a and 104b mounted on an inert element 102. Inert element 102 may be, for example, aluminum or some other suitable non-piezoelectric element. As shown in FIG. 1B, ferroelectric elements 104a and 104b are slabs of mater that are mounted on inert element 102. As shown in FIG. 1A, the ferroelectric elements of ferroelectric elements 104a and 104b are electrically coupled to electronics 106. Electronics 106 may include driver circuits or receiver elements such as that illustrated, for example, in U.S. Pat. No. 6,661,737. As described therein, this illustrative embodiment of transducer 100 provides a bi-polar acoustic wave as it is driven by electronics 106.

Figure 2A:
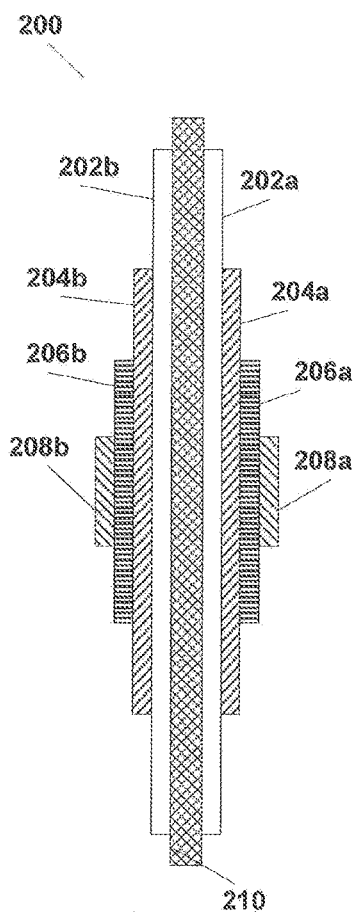
FIGS. 2A, 2B, 2C, and 2D illustrate embodiments of a stacked bender bar according to certain illustrative embodiments of the present disclosure.

FIGS. 2A, 2B, 2C, and 2D illustrate certain illustrative embodiments of a bender bar transducer 200 according to aspects of the present disclosure. As shown in FIG. 2A, bender bar transducer 200 includes an inert element 210. Multiple ferroelectric slabs are mounted in layers on each side of inert element 210 to form a stacked bender bar. As shown in the particular example illustrated in FIG. 2A, ferroelectric elements 202a and 202b are mounted on opposite sides of inert element 210. Ferroelectric element 204a is mounted on ferroelectric element 202a and ferroelectric element 204b is mounted on ferroelectric element 202b. Ferroelectric element 206a is mounted on ferroelectric element 204a and ferroelectric element 206b is mounted on ferroelectric element 204b. Ferroelectric element 208a is mounted on ferroelectric element 206a and ferroelectric element 208b is mounted on ferroelectric element 206b.

FIGS. 2A, 2B, 2C and 2D specifically illustrate an example embodiment with three pairs of stacked ferroelectric elements—ferroelectric elements 204a and 204b, 206a and 206b, and 208a and 208b. Alternatively, any number of pairs of ferroelectric elements can be utilized, as the example illustrated in FIGS. 2A, 2B, 2C, and 2D are illustrative only.

Inert element 210 can be any element that is not ferroelectric in nature. For example, inert element 120 can be Al, brass, titanium, or any metal or alloy. Ferroelectric elements 202a, 202b, 204a, 204b, 206a, 206b, 208a, and 208b can be any ferroelectric elements, for example lead zirconate titanate (PZT), barium titanate ($BaTiO_3$), Gallium orthophosphate ($GaPO_4$), Tourmaline, Quartz, or other ferroelectric material. The term ferroelectric material is used to refer to any ferroelectric or relaxor ferroelectric material that exhibits a coupling between voltage and mechanical motion. The ferroelectric material can be a ceramic or a polymer. Without limitation, the ferroelectric material can be described as an electrostrictor, a piezoceramic, piezopolymer, magnetostrictor, or a shape memory ceramic. As shown in FIG. 2A, pairs of ferroelectric elements—ferroelectric elements 202a, 202b; 204a, 204b; 206a, 206b; and 208a, 208b—are stacked. Each layer of ferroelectric element in the stacking can have different thicknesses and can have differing widths and lengths. For purposes of this disclosure, thickness refers to the dimension perpendicular to the largest planar surface of inert element 210, the surfaces on which ferroelectric element 202a and 202b are mounted, and the length and width refer to dimensions in the plane of inert element 210. The various layers of ferroelectric element are differently sized and may be of different types of ferroelectric elements in order to better control the response of transducer 200.

Figure 2B:
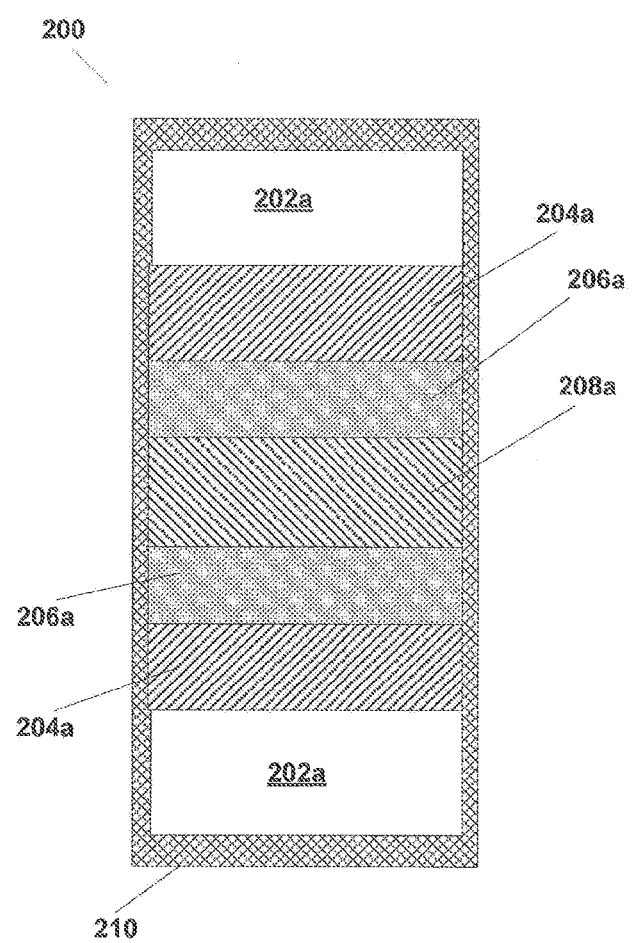

FIG. 2B illustrates an illustrative stacking arrangement of transducer 200. As shown in FIG. 2B, each of ferroelectric elements 202a, 204a, 206a, and 208a are rectangular bars with each of them of different lengths but similar widths. As shown in FIG. 2B, ferroelectric element 202a is mounted to inert element 210 in a symmetric fashion. Ferroelectric element 204a is symmetrically mounted on ferroelectric element 202a. Ferroelectric element 206a is symmetrically mounted on ferroelectric element 204a, ferroelectric element 208a is symmetrically mounted on ferroelectric element 206a, while ferroelectric elements 202b, 204b, 206b, and 208b are similarly stacked on the opposite side of inert element 210, as is shown in FIG. 2A.

Figure 2C:
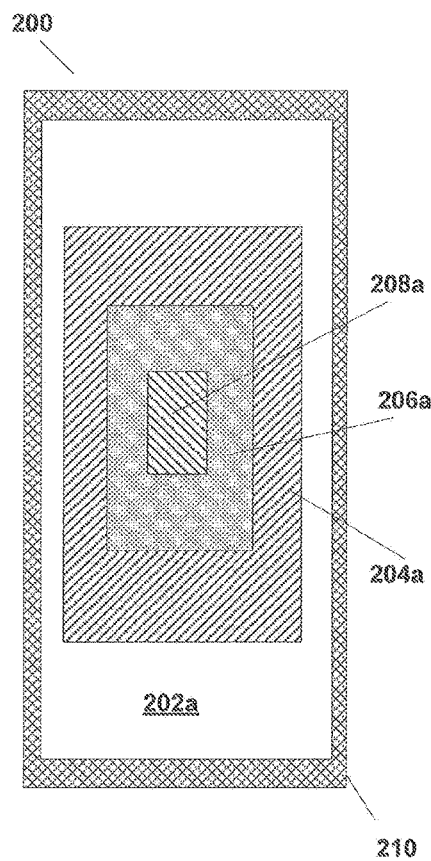

FIG. 2C illustrates another example of a stacking arrangement of transducer 200. As shown in FIG. 2C, each of ferroelectric elements 202a, 204a, 206a, and 208a are rectangular bars having differing dimensions in both length and width. As shown in FIG. 2C, ferroelectric element 202a is symmetrically mounted on inert element 210. Ferroelectric element 204a is symmetrically mounted on ferroelectric element 202a; ferroelectric element 206a is symmetrically mounted on ferroelectric element 204a; and ferroelectric element 208a is symmetrically mounted on ferroelectric element 206a. Ferroelectric elements 202b, 204b, 206b, and 208b are the same sizes as ferroelectric elements 202a, 204a, 206a, and 208a and are similarly arranged on the opposite side of inert element 210.

Figure 2D:
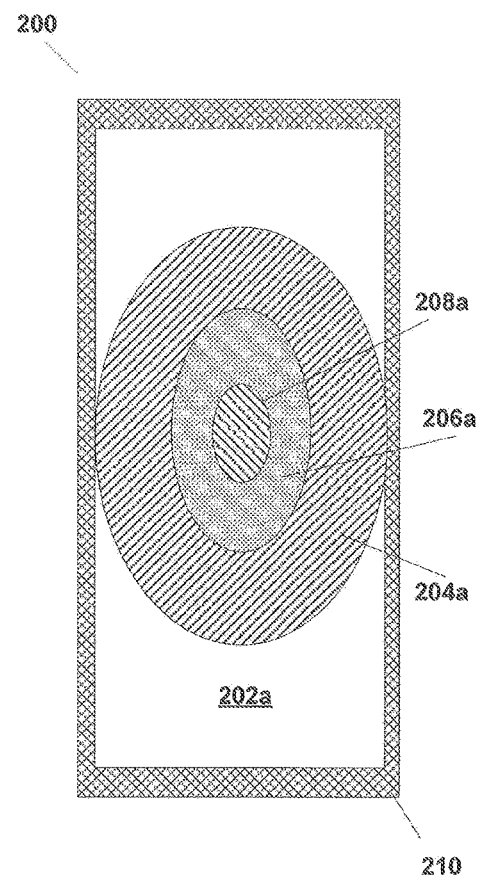

FIG. 2D illustrates another example of a stacking arrangement of transducer 200. As shown in FIG. 2D, only ferroelectric element 202a is rectangular in shape. Ferroelectric elements 204a, 206a, and 208a are elliptical, or disc-shaped, slabs in shape, with the minor and major axis of the ellipse corresponding to width and length directions, respectively. As shown in FIG. 2D, each of the elliptical layers 204a, 206a, and 208a are of different sizes. Further, ferroelectric element 202a is symmetrically mounted on inert element 210. Ferroelectric element 204a is symmetrically mounted on ferroelectric element 202a; ferroelectric element 206a is symmetrically mounted on ferroelectric element 204a; and ferroelectric element 208a is symmetrically mounted on ferroelectric element 206a. Ferroelectric elements 202b, 204b, 206b, and 208b are the same sizes and shapes as ferroelectric elements 202a, 204a, 206a, and 208a and similarly arranged on the opposite side of inert element 210.

The stacked ferroelectric element pairs 204a and 204b, 206a and 206b, and 208a and 208b can provide mass loading to the dipole at the center of maximum bending. This mass loading forces the frequency response of transducer 200 toward lower frequencies and lowers the quality factor Q, as was disclosed in U.S. Pat. No. 7,692,363; however, the mass loading proposed in that disclosure was not capable of being driven. In accordance with one or more illustrative embodiments of the present disclosure, each of ferroelectric element pairs 202a and 202b, 204a and 204b, 206a and 206b, and 208a and 208b can be independently driven with controlled pulses to enhance further the low frequency response of transducer 200.

Figure 3:
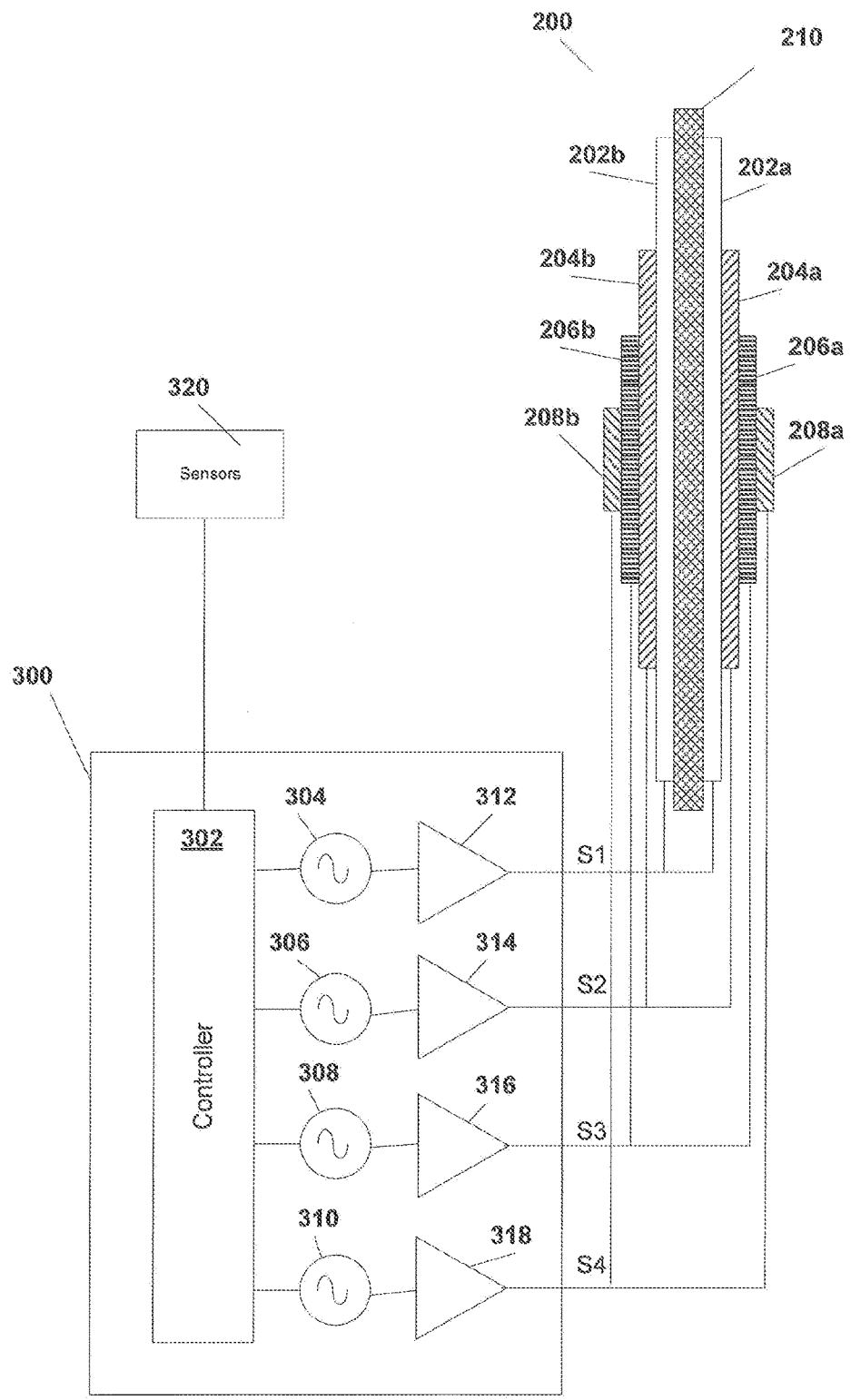
FIG. 3 illustrates a schematic for driving bipolar elements of stacked bender bars such as those illustrated in FIGS. 2A, 2B, 2C, and 2D.

FIG. 3 illustrates a schematic of a driver 300 for driving each bipolar element, a bipolar element being formed by each of the ferroelectric element pairs. In some embodiments, individual (unipolar) elements (formed by individual ones of ferroelectric elements) can be driven separately by driver circuit 300 to achieve asymmetric acoustic radiation.

The embodiment of driver circuit 300 illustrated in FIG. 3 is a bipolar driver where individual ferroelectric pairs (ferroelectric element 202a and 202b; 204a and 204b; 206a and 206b; and 208a and 208b) are driven simultaneously and synchronously. As shown in FIG. 3, driver 300 includes a controller 302 that controls pulse generators 304, 306, 308, and 310. Pulse generator 304 is coupled through a driver 312 to produce signal S1, which is coupled to drive ferroelectric element 202a and 202b. Pulse generator 306 is coupled through a driver 314 to produce signal S2, which is coupled to drive ferroelectric element 204a and 204b. Pulse generator 308 is coupled through a driver 316 to produce signal S3, which is coupled to drive ferroelectric element 206a and 206b. Pulse generator 310 is coupled through a driver 318 to produce signal S4, which is coupled to drive ferroelectric element 208a and 208b.

In some embodiments of the present disclosure, output signals produced by transducer 200 can be detected by sensors 320. Signals from sensors 320 can be input to controller 302, which can then adjust the signals S1, S2, S3, and S4 supplied to transducer 200 to provide desirable results. One such desirable result can be, for example, enhancing the dipole nature of transducer 200 and the suppression of other modes of vibration.

FIGS. 4A, 4B, and 4C illustrate the results of different driving pulses for S1, S2, S3, and S4. As shown in FIG. 4A, signals S1, S2, S3, and S4 that are in phase with one another will add to the effect and produce a large signal. FIG. 4B illustrates the effects of shifting signals S1, S2, S3, and S4 in phase with respect to one another. As shown in FIG. 4B, the resulting output signal is broader. As shown in FIG. 4C, as the phase between the impulses S1, S2, S3, and S4 are increased, the resulting output signal becomes more diffuse.

Some embodiments of transducer 200 can experience larger displacements due to the stacking of ferroelectric elements, resulting in mass loading as well as the ability to drive multiple pairs of ferroelectric elements. The overall thickness of the stacking and resulting mass loading can also result in a lower frequency response and a lower Q. Controlling the pulses to each of the ferroelectric element pairs in frequency, amplitude, and shape can produce much lower or higher frequency responses with larger displacements. The displacements, as illustrated above, can be controlled by adjusting the phasing between individual signals supplied to the ferroelectric element pairs. In some embodiments, controlling pulse signals to individual pairs of ferroelectric elements can also be used to equalize the dipole displacement at both sides and thereby minimize Stoneley mode generation (generation of waves that travel along the wellbore). This effectively enhances a pure dipole signal output signal and increases the dipole signal-to-noise (S/N). In some embodiments of the present disclosure, numerous adaptive pulse controls produced by monitoring the output signals can be added to improve the dipole quality of the output signals produced by transducer 200.

Performance of a basic bender bar 100 with an embodiment of a stacked bender bar 200 was modeled and compared with utilizing a WaveSonic™ (Halliburton Acoustic logging tool) dipole source, which could have included transmitter driving circuit board Part No. 101507949 and Wireline Tool part no 101378058 manufactured by Halliburton Energy Services, Inc. The performance of the bender bar 100 was modeled and analyzed utilizing a multiphysics modeling package by COMSOL, Inc. (COMSOL) and a second package by Simulia, Inc., called the ABAQUS software packages (ABAQUS). Both COMSOL and ABAQUS are finite element multi-physics modeling packages.

It was found that the COMSOL package is not stable and could not produce any dynamic response. As a result, only ABAQUS modeling results are presented in this disclosure.

The software package ABAQUS is capable of performing several kinds of analysis to give insight to the performance of a bender bar. These analyses include Natural Frequency Extraction, Direct-Solution Steady-State Dynamic Analysis, and Implicit Dynamic Analysis using Direct Integration. The response was modeled without loading (no surrounding medium). The proposed concepts of this discloser are verifiable utilizing this software and the results are provided below.

Figure 5:
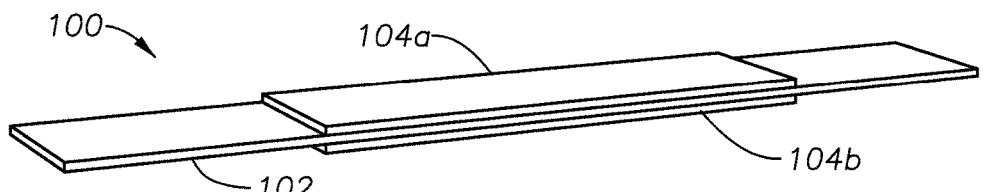
FIG. 5 illustrates a particular example of a basic bender bar as shown in FIG. 1.

FIG. 5 illustrates a particular example of bender bar 100 that was utilized for analysis as discussed above. In this analysis, bender bar 100 is a PZT bender bar. Specifically, inert element 102 is a brass plate of thickness 0.125 inch, length 7.7 inch, and width 1.1 inch. Ferroelectric elements 104a and 104b are PZT crystal (C5400 or PZT-4 that may be purchased, for example, from Channel Industries or Piezo Technologies). Each of Ferroelectric elements 104a and 104b has a thickness of 0.125 inch, length of 4.0 inch, and width of 1.0 inch. Ferroelectric elements 104a and 104b are bonded to inert element 102, for example, with epoxy or a resin.

Figure 6A:
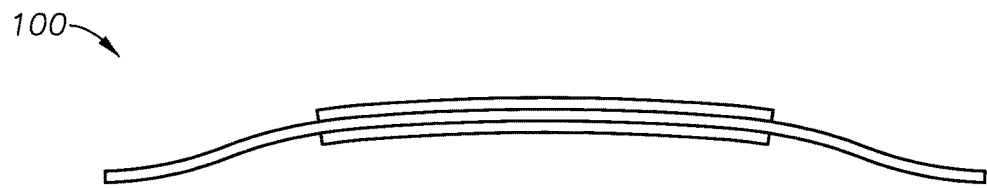
FIGS. 6A, 6B, and 6C illustrate three symmetrical harmonic modes for the illustrative bender bar illustrated in FIG. 5.
Figure 6B:
Figure 6C:
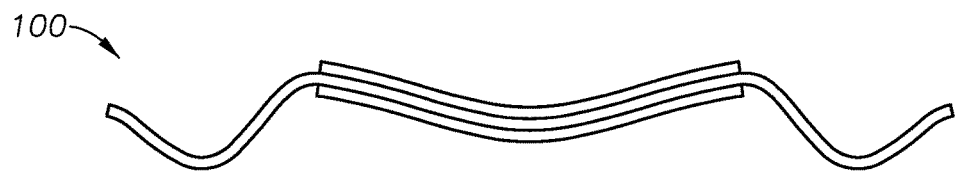
Figure 7:
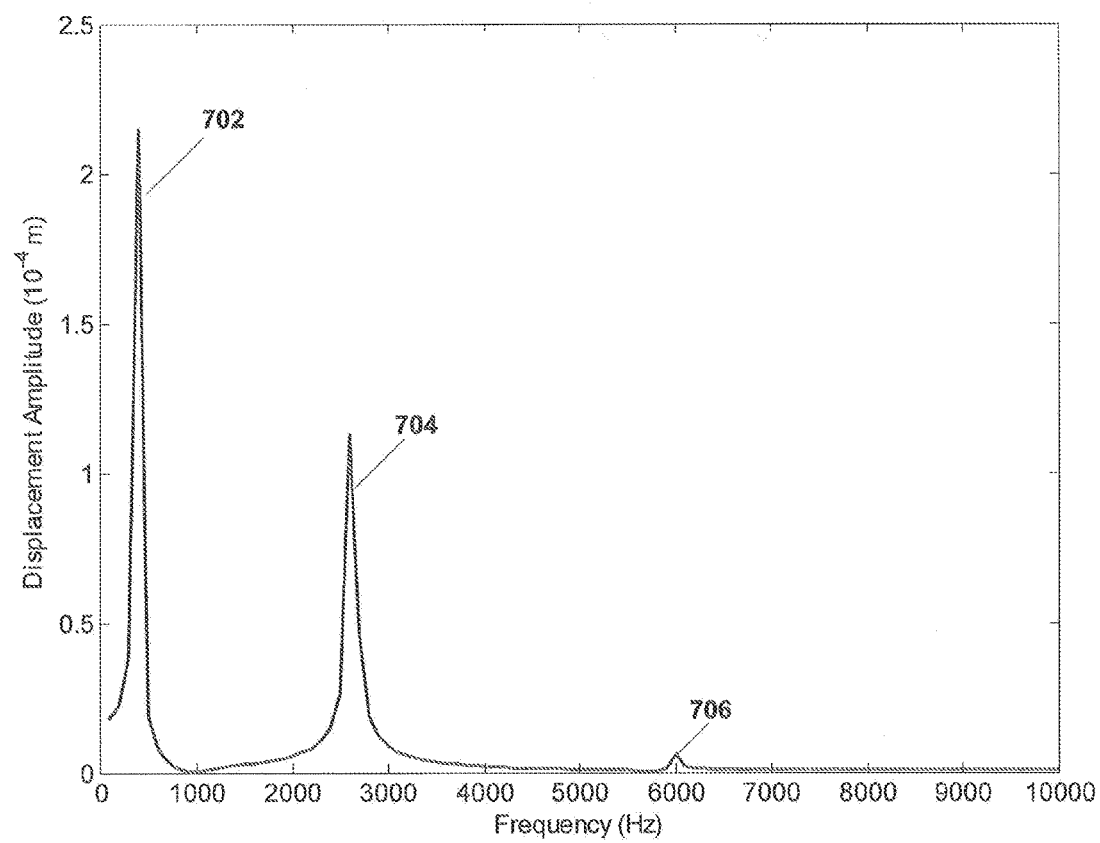
FIG. 7 illustrates the harmonic displacement of the center point of the illustrative bender bar illustrated in FIG. 5.

Natural Frequency Extraction (Modal analysis) is performed utilizing the particular example of bender bar 100 illustrated in FIG. 5 to calculate the natural frequencies and the corresponding mode shapes of bender bar 100. The ABAQUS model utilizes an eigenvalue analysis to find the various modes and mode frequencies. For the WaveSonic™ bender bar model shown in FIG. 5, 14 vibrational modes between 0 and 10 kHz where found. Those modes are listed in Table 1. The more important modes are the symmetric modes, which for bender bar 100 of FIG. 5 are listed as mode 1 at 383.6 Hz, mode 5 at 2622.8 Hz, and mode 9 at 5887.7 Hz, which are themselves illustrated in FIGS. 6A, 6B, and 6C, respectively. The harmonic displacement of the center point is illustrated in FIG. 7 as a function of frequency.

TABLE 1

| Mode | 1 | 2 | 3 | 4 | 5 | 6 | 7 |
|---|---|---|---|---|---|---|---|
| Freq(Hz) | 383.6 | 956.5 | 1009.2 | 1762.6 | 2622.8 | 4709 | 4717 |
| Mode | 8 | 9 | 10 | 11 | 12 | 13 | 14 |
| Freq(Hz) | 5306.4 | 5887.7 | 6290.7 | 6846.6 | 7856.1 | 8217.4 | 9330 |

Bender bar 100 can have several types of mode shapes. The various types of bending include, for example, twisting, swinging sidewise, and swinging lengthwise. Among these, only certain symmetric bending modes provide substantial pressure when bender bar 100 is coupled to an acoustic medium. FIGS. 6A, 6B, and 6C show symmetric bending modes corresponding to the modes at 363.6 Hz, 2622.8 Hz, and 5887.7 Hz, respectively. FIGS. 6A, 6B, and 6C are not to scale and are provided to emphasize the mode shapes only. FIG. 6A shows a mode having no internal nodes. FIG. 6B illustrates a mode having two internal nodes. FIG. 6C shows a mode having 4 internal nodes.

FIG. 7 shows the harmonic displacement in Z-direction of the center point of the bar. In this model, illustrated in FIG. 7, there is no loading (i.e., no surrounding medium). FIG. 7 illustrates peaks 702, 704, and 706, corresponding to mode 1, mode 5, and mode 9 of Table 1, respectively. The results illustrated in FIG. 7 are based on a theoretical model of the ABAQUS system. FIG. 7 illustrates that peaks 702, 704, and 706 are observed at the symmetrical modes 1, 5, and 9 shown in FIGS. 6A, 6B, and 6C, respectively.

Figure 8:
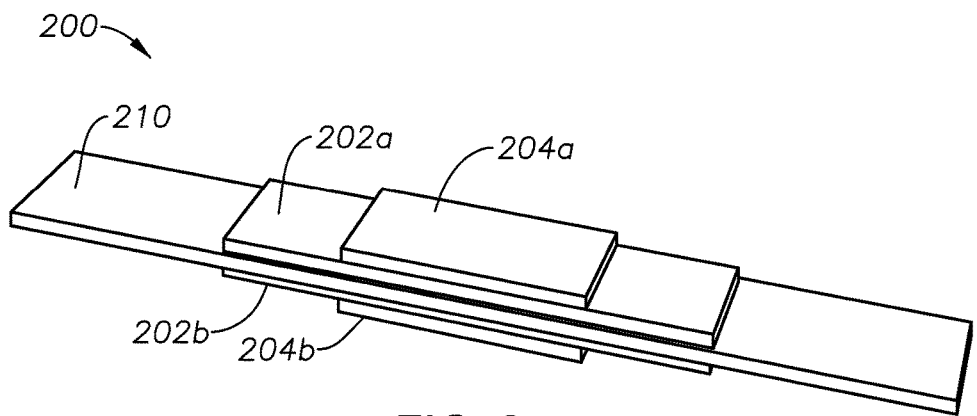
FIG. 8 illustrates a particular example of a stacked bender bar such as that illustrated in FIGS. 2A and 2B according to certain illustrative embodiments of the present disclosure.

FIG. 8 illustrates a particular example of a stacked bender bar 200 on which frequency calculations can be performed. In the embodiment shown in FIG. 8, stacked bender bar 200 includes inert element 210, ferroelectric elements 202a and 202b and ferroelectric elements 204a and 204b. Inert element 210 and ferroelectric elements 202a and 202b are the same elements and dimensions as inert element 102 and ferroelectric elements 104a and 104b illustrated in FIG. 5. In other words, inert element 210 is a brass plate of thickness 0.125 inch, length 7.7 inch, and width 1.1 inch. Ferroelectric elements 202a and 202b are PZT crystal (C5400 or PZT-4, which may be purchased, for example, from Channel Industries or Piezo Technologies). Each of Ferroelectric elements 202a and 202b has a thickness of 0.125 inch, length of 4.0 inch, and width of 1.0 inch. Ferroelectric elements 202a and 202b are bonded to inert element 210 with an epoxy or resin. Ferroelectric elements 204a and 204b are half sized of ferroelectric elements 202a and 202b, having thickness of 0.125 inch, length of 2.0 inch, and width of 1.0 inch. Ferroelectric elements 204a and 204b are bonded to ferroelectric elements 202a and 202b, respectively, with epoxy or resin.

Figure 9A:
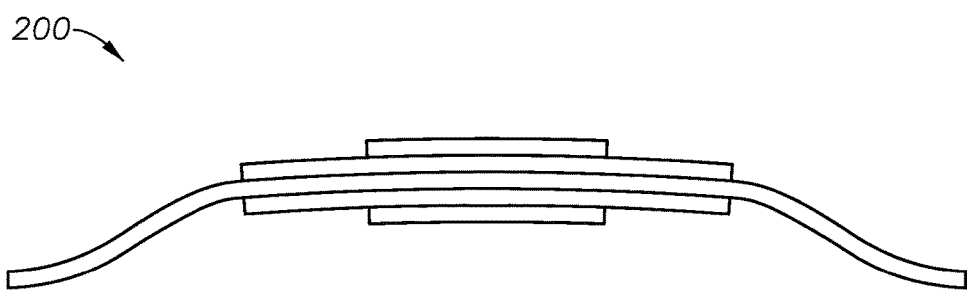
FIGS. 9A, 9B, and 9C illustrate three symmetric modes of the stacked bender bar illustrated in FIG. 8.
Figure 9B:
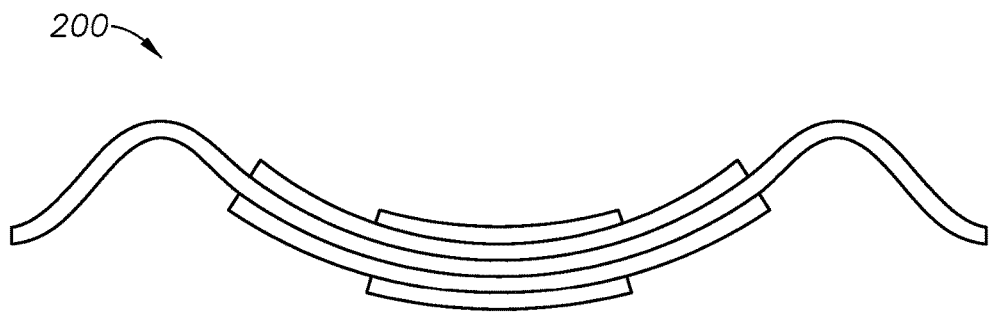
Figure 9C:
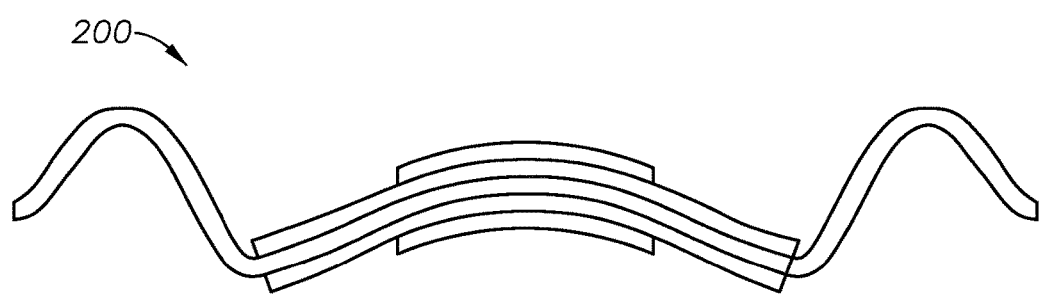
Figure 10:
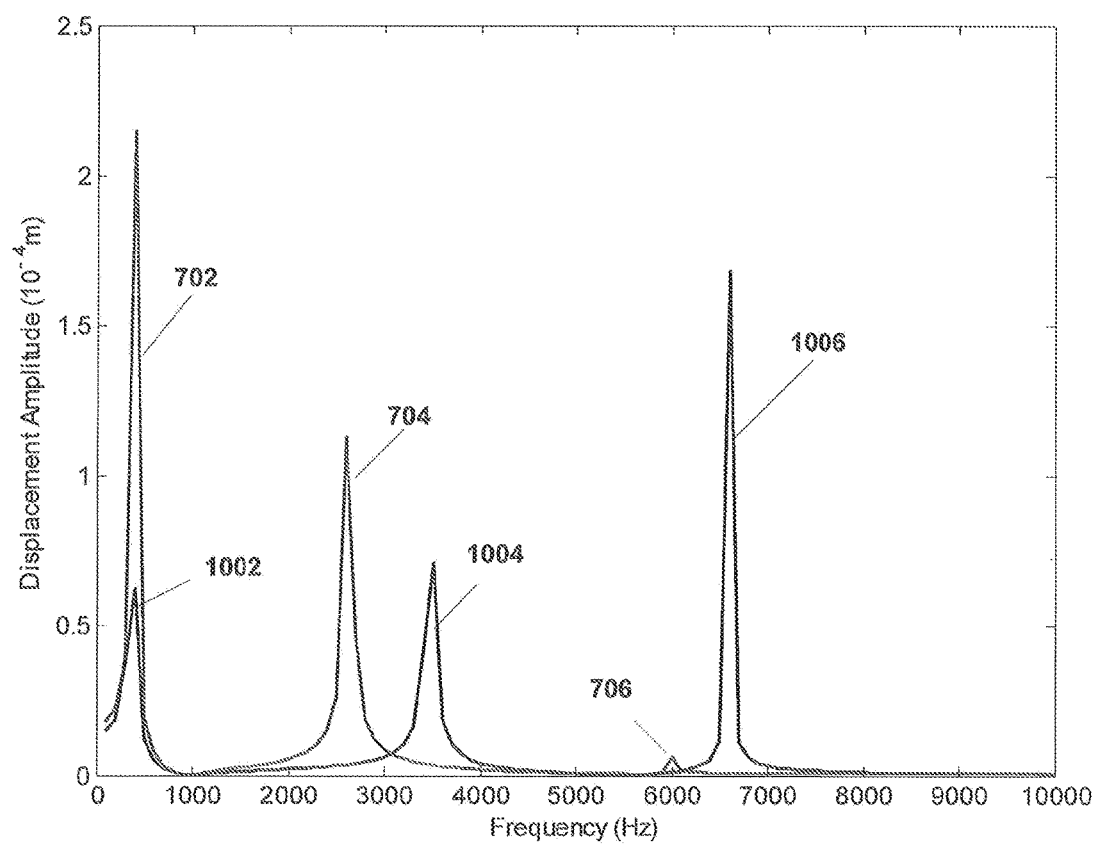
FIG. 10 illustrates a comparison of the harmonic displacement in the Z direction of the stacked bender bar illustrated in FIG. 8 with that of the bender bar illustrated in FIG. 5.

The calculated natural frequencies for stacked bender bar 200 shown in FIG. 8 are given in Table 2. Modes 1, 5, and 10 correspond to three symmetric mode shapes, which are illustrated in FIGS. 9A, 9B, and 9C, respectively. FIG. 10 illustrates the harmonic displacement in Z direction of bender bar 200 illustrated in FIG. 8 compared to those of bender bar 100 illustrated in FIG. 5.

TABLE 2

| Mode | 1 | 2 | 3 | 4 | 5 | 6 | 7 |
|---|---|---|---|---|---|---|---|
| Freq(Hz) | 367.53 | 856.3 | 944.01 | 1590.7 | 3463.9 | 4567.8 | 4869 |
| Mode | 8 | 9 | 10 | 11 | 12 | 13 | 14 |
| Freq(Hz) | 5518.1 | 6016.1 | 6593.3 | 6738.6 | 9016.2 | 9054.3 | 9334 |

FIGS. 9A, 9B, and 9C show Symmetric bending modes of the example of bender bar 200 illustrated in FIG. 8. In accordance with Table 2, FIG. 9A illustrates mode 1 at 367.53 Hz, FIG. 9B illustrates mode 5 at 3463.9 Hz, and FIG. 9C illustrates mode 10 at 6593.3 Hz. These modes represent the lower frequency symmetric modes of bender bar 200, with mode 1 of bender bar 200 having 0 nodes illustrated in FIG. 9A, with mode 5 of bender bar 200 having 2 nodes illustrated in FIG. 9B, and with mode 10 of bender bar 200 having 4 nodes illustrated in FIG. 9C.

FIG. 10 illustrates the harmonic displacement in the Z-direction of the center point of the example bender bar 200 illustrated in FIG. 8 in comparison with bender bar 100 as illustrated in FIG. 5. Peaks 702, 704, and 706 corresponding to modes 1, 5, and 9, respectively, of bender bar 100 of FIG. 5 are illustrated. Peaks 1002, 1004, and 1006 corresponding to modes 1, 5, and 10, respectively, of bender bar 200 of FIG. 8 are illustrated. As shown in FIG. 10 and Tables 1 and 2, peaks 1004 and 1006 are shifted to higher frequencies while peak 1002 is shifted to a slightly lower frequency.

The stacked bender bar computed results illustrated in FIG. 10 show that the addition of the additional ferroelectric element 204a and 204b, which provides extra mass, did not reduce the frequency response, and instead adjusted the frequency of most of the symmetric modes to higher frequency. The frequency (f) of the modes of a mechanical system is governed by the relation:

$$f \to \sqrt{\frac{k}{m}},\qquad \text{Eq. (1)}$$

where k=stiffness and m=mass. If the mass m increases compared to stiffness k, the frequency will be lower. However, as shown in FIG. 10, it seems the stiffness k is increasing more than the mass m, resulting in an increase in frequency. Therefore, embodiments of the disclosure as illustrated in FIGS. 2A, 2B, 2C, and 2D and in FIG. 8 can be utilized to shift operating frequencies of bender bars to higher frequencies.

Figure 11A:
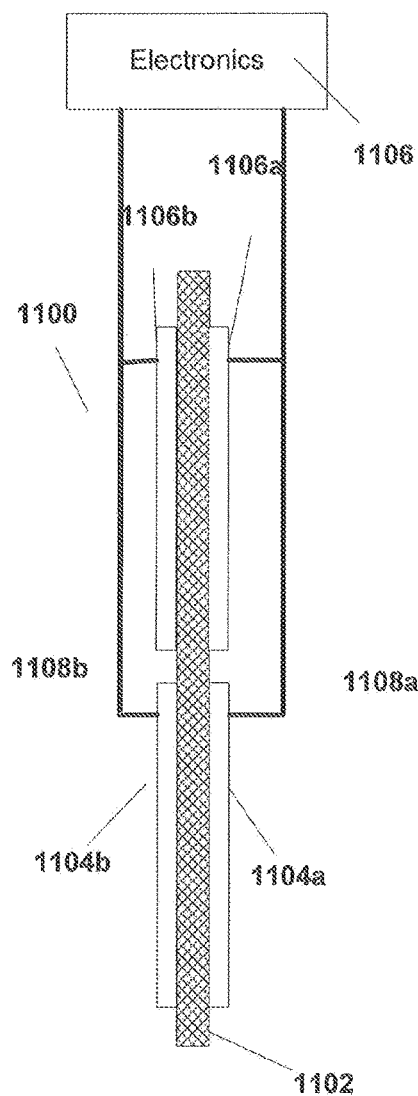
FIGS. 11A and 11B illustrate a bender bar according to certain illustrative embodiments of the present disclosure.
Figure 11B:
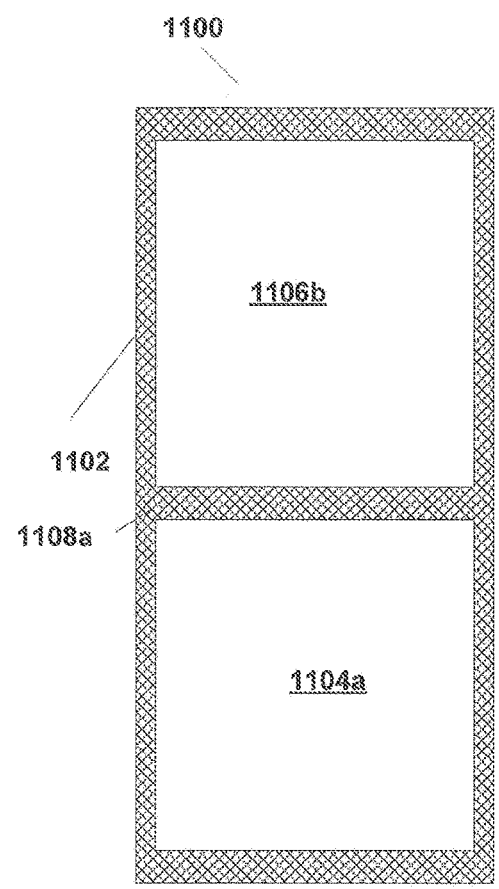
Figure 11C:
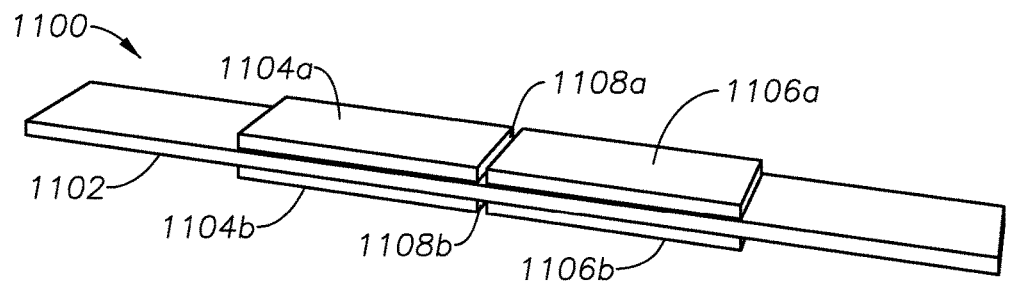
FIG. 11C illustrates a particular example of the bender bar illustrated in FIGS. 11A and 11B.

FIGS. 11A, 11B, and 11C illustrate a bender bar transducer 1100 according to some embodiments of the present disclosure that may lower the frequency and may provide more power. As shown in FIG. 11, transducer 1100 includes an inert element 1102. Transducer 1100 also includes pairs of ferroelectric elements, ferroelectric elements 1104a and 1104b and ferroelectric elements 1106a and 1106b, bonded to inert element 1102 such that there are gaps 1108a and 1108b at the center point of inert element 1102. Bender bar 1100 is similar to bender bar 100, except that the stiffness k is reduced by stripping off portions of ferroelectric elements 104a and 104b from the middle of bender bar 100 to form ferroelectric elements 1104a and 1104b and 1106a and 1106b.

In a particular example as shown in FIG. 11C, inert element inert element 1102 is a brass plate of thickness 0.125 inch, length 7.7 inch, and width 1.1 inch. Ferroelectric elements 1104a and 1104b and ferroelectric elements 1106a and 1106b are PZT crystal (C5400 or PZT-4 purchased from Channel Industries or Piezo Technologies). Each of ferroelectric elements 1104a and 1104b and ferroelectric elements 1106a and 1106b has a thickness of 0.125 inch, width of 1.0 inch, and length of 2 inch. Ferroelectric element 1104a and ferroelectric element 1106a are positioned symmetrically on one side of inert element 1102 such that a 0.063 inch gap is formed along a center line of inert element 1102. Similarly, ferroelectric element 1104b and 1106b are positioned symmetrically on the other side of inert element 1102 such that a 0.063 inch gap is formed on the center line of inert element 1102. Ferroelectric elements 1104a and 1104b and ferroelectric elements 1106a and 1106b are bonded to inert element 1102 with an epoxy or resin.

Figure 12A:
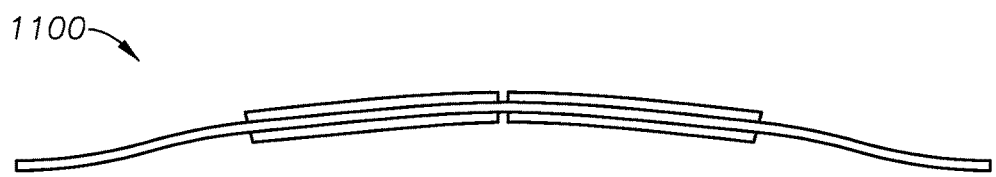
FIGS. 12A, 12B, and 12C illustrate three symmetric mode shapes for the bender bar illustrated in FIG. 11C.
Figure 12B:
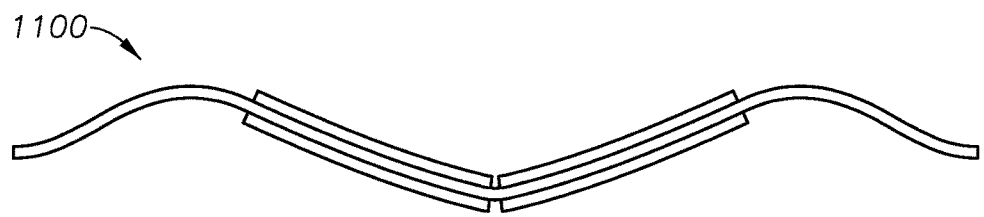
Figure 12C:
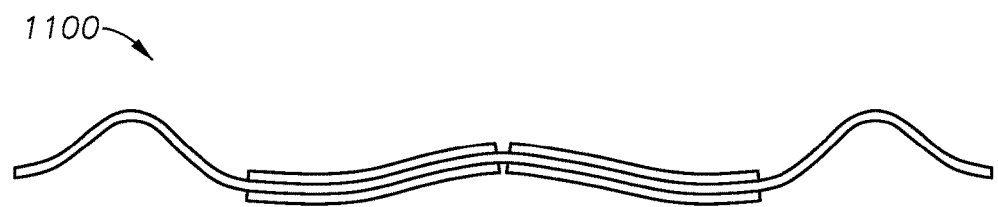

The calculated natural frequencies of bender bar 1100 as illustrated in FIG. 11C with the dimensions described above are shown in Table 3. FIGS. 12A, 12B, and 12C illustrate the three symmetric mode shapes indicated by mode 1 at 352.39 Hz, mode 5 at 2035.7 Hz, and mode 9 at 5654.2 Hz in Table 3. As discussed above, the displacements shown in FIGS. 12A, 12B, and 12C are not to scale.

TABLE 3

| Mode | 1 | 2 | 3 | 4 | 5 | 6 | 7 |
|---|---|---|---|---|---|---|---|
| Freq (Hz) | 352.39 | 967.65 | 1019.1 | 1732.8 | 2035.7 | 4614.2 | 4678.2 |
| Mode | 8 | 9 | 10 | 11 | 12 | 13 | 14 |
| Freq (Hz) | 4732.7 | 5654.2 | 6325.6 | 6778.7 | 7628.5 | 8204.0 | 8967.9 |

Figure 13:
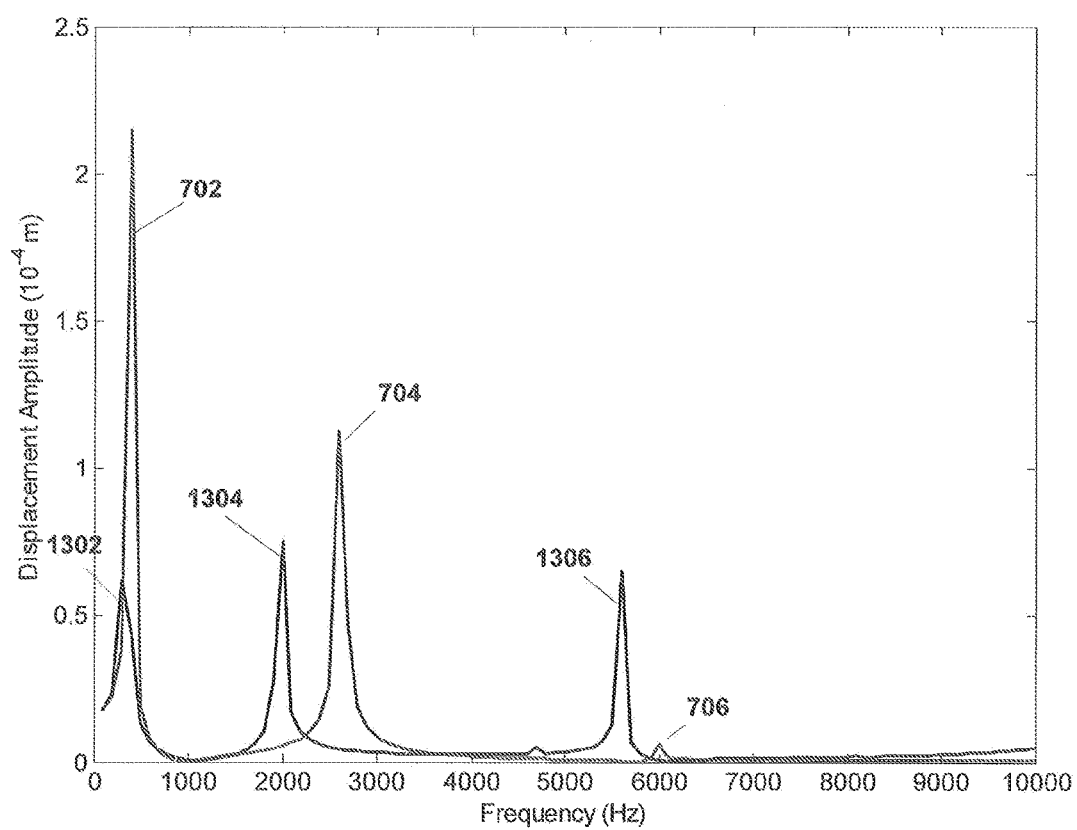
FIG. 13 illustrates a comparison of the harmonic displacement in the Z direction of the bender bar illustrated in FIG. 11C with that of the bender bar illustrated in FIG. 5.

FIG. 13 illustrates the harmonic displacement in Z-direction of the center point of bender bar 1100 illustrated by FIG. 11C in comparison with the harmonic displacement bender bar 100 as illustrated by FIG. 5. As shown in FIG. 13, peak 702 corresponds to mode 1 of bender bar 100, peak 704 corresponds to mode 5 of bender bar 100, and peak 706 corresponds to mode 9 of bender bar 100. The mode frequencies for bender bar 100 are illustrated in Table 1. In comparison, mode 1 of bender bar 1100 results in peak 1302, mode 5 of bender bar 1100 results in peak 1304, and mode 9 of bender bar 1100 results in peak 1306. From these calculated results, it is clear that the split bender bar 1100 shifts lower the natural frequency of the symmetric modes of bender bar 1100 compared to that of the un-split bender bar 100.

FIGS. 14A, 14B, 14C, and 14D illustrate a stacked and split embodiment bender bar 1400. The example embodiment illustrated in FIG. 14A, for example, includes inert element 1410 with multiple layers of ferroelectric elements on each side, arranged such that gaps 1420a and 1420b are formed in the stacked ferroelectric elements at a center line of bender bar 1400. Any number of layers can be utilized. The particular example illustrated in FIG. 14A should not be considered limiting.

As shown in FIG. 14A, ferroelectric elements 1402a and 1402b and ferroelectric elements 1412a and 1412b are bonded to inert element 1410 in such a fashion that a gap 1420a is formed between ferroelectric element 1402a and 1412a and a gap 1420b is formed between ferroelectric element 1402b and 1412b. Ferroelectric element 1402a and 1402b and ferroelectric element 1412a and 1412b can all be of the same size and shape and are positioned such that loading of inert element 1410 is symmetrical around the center line at gap 1420b and 1420a.

Similarly, ferroelectric elements 1404a is bonded on ferroelectric element 1402a, ferroelectric element 1404b is bonded on ferroelectric element 1402b, ferroelectric element 1414a is bonded on ferroelectric element 1412a, and ferroelectric element 1414b is bonded on ferroelectric element 1412b so that the loading is symmetrical and that the gaps 1420a and 1420b are maintained. Similarly, ferroelectric element 1406a is bonded on ferroelectric element 1404a, ferroelectric element 1416a is bonded on ferroelectric element 1414a, ferroelectric element 1406b is bonded on ferroelectric element 1404b and ferroelectric element 1416b is bonded on ferroelectric element 1414b. Additionally, ferroelectric element 1408a is bonded on ferroelectric element 1406a, ferroelectric element 1418a is bonded on ferroelectric element 1416a, ferroelectric element 1408b is bonded on ferroelectric element 1406b, and ferroelectric element 1418b is bonded on ferroelectric element 1416b. As a consequence, stacks of ferroelectric element are formed on inert element 1410 in such a way that gaps 1420a and 1420b are formed between the ferroelectric elements. In some embodiments, this arrangement adds to the mass loading m of bender bar 1400, it does not increase the stiffness k, resulting in lowered operating frequencies.

FIG. 14B illustrates some embodiments of bender bar 1400 as illustrated in FIG. 14A, where each of ferroelectric elements 1402a, 1404a, 1406a, and 1408a and ferroelectric elements 1412a, 1414a, 1416a, and 1418a (and correspondingly 1402b, 1404b, 1406b, and 1408b and ferroelectric elements 1412b, 1414b, 1416b, and 1418b) are rectangular and have the same width, but differing lengths. Each layer may also have a different thickness.

Figure 14C:
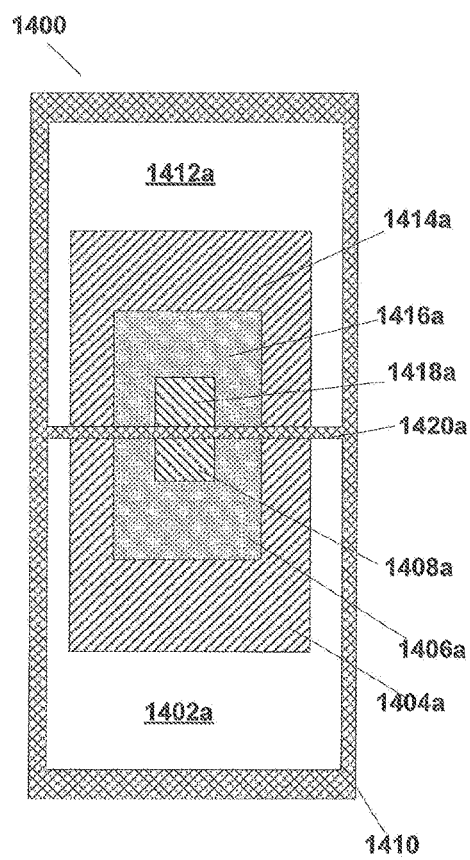

FIG. 14C illustrates some embodiments where each of ferroelectric elements 1402a, 1404a, 1406a, and 1408a and ferroelectric elements 1412a, 1414a, 1416a, and 1418a (and correspondingly 1402b, 1404b, 1406b, and 1408b and ferroelectric elements 1412b, 1414b, 1416b, and 1418b) are rectangular and have differing widths and lengths. Again, thicknesses may differ between layers.

Figure 14D:
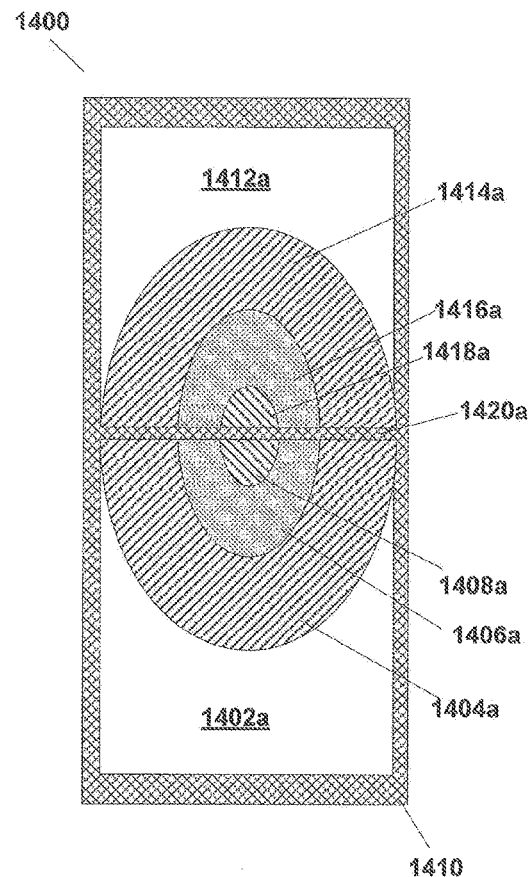

FIG. 14D illustrates some embodiments where each of ferroelectric elements 1402a and 1412a (and correspondingly 1402b and 1412b) are rectangular and ferroelectric elements 1404a, 1406a, and 1408a and ferroelectric elements 1412a, 1414a, 1416a, and 1418a (and correspondingly 1404b, 1406b, and 1408b and ferroelectric elements 1414b, 1416b, and 1418b) are semi-elliptical slabs and of differing major and minor axis lengths. In such case, ferroelectric elements 1404a and 1414a together form a whole ellipse with a cut in the center at gap 1420a; ferroelectric elements 1406a and 1416a form a whole ellipse with a cut in the center at gap 1420a; and ferroelectric elements 1408a and 1418a form a whole ellipse with a cut in the center at gap 1420a. Again, thicknesses may differ between layers.

Figure 15:
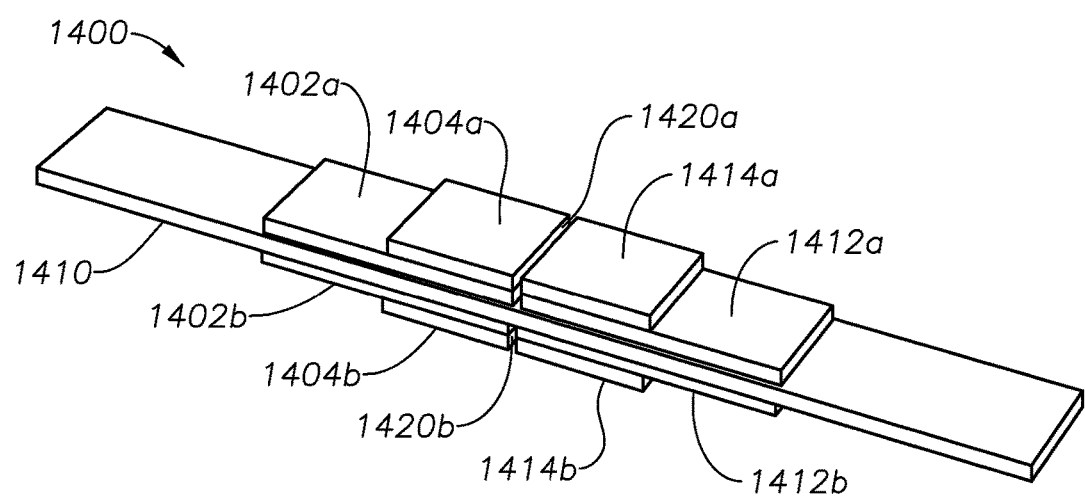
FIG. 15 illustrates a particular example of the bender bar illustrated in FIGS. 14A and 14B.

FIG. 15 illustrates a particular example of bender bar 1400. The particular example of bender bar 1400 of FIG. 15 includes ferroelectric elements 1402a and 1402b, ferroelectric elements 1404a and 1404b, ferroelectric elements 1412a and 1412b, and ferroelectric elements 1414a and 1414b to form a two-layered stack. The results of calculations of the natural frequencies of such a system are provided in Table 4. In that calculation, Inert element 1410 and ferroelectric elements 1402a and 1402b and ferroelectric elements 1412a and 1412b are the same elements and dimensions as inert element 1100 and ferroelectric elements 1104a and 1104b and ferroelectric elements 1106a and 1106b illustrated in FIG. 5. In other words, inert element 1410 is a brass plate of thickness 0.125 inch, length 7.7 inch, and width 1.1 inch. Ferroelectric elements 1402a, 1402b, 1404a, 1404b, 1412a, 1412b, 1414a, and 1414b are PZT crystal (C5400 or PZT-4, which can be purchased, for example, from Channel Industries or Piezo Technologies).

Each of Ferroelectric elements 1402a and 1402b and ferroelectric elements 1412a and 1412b has a thickness of 0.125 inch, width of 1.0 inch, and length of 2 inches. Ferroelectric elements 1402a and 1412a and ferroelectric elements 1402b and 1412b are positioned to form gap 1420a and 1420b, respectively, of width 0.03 inch. Ferroelectric elements 1402a and 1402b and ferroelectric elements 1412a and 1412b are bonded to inert element 210 by an epoxy or resin. Ferroelectric elements 1404a and 1404b and ferroelectric elements 1414a and 1414b have thickness of 0.125 inch, width of 1.0 inch, and length of 1 inch. Ferroelectric elements 1404a and 1414a and ferroelectric elements 1404b and 1414b are positioned to form gaps 1420a and 1420b, respectively, of width 0.03 inch. Ferroelectric elements 1404a and 1404b are bonded to ferroelectric elements 1402a and 1402b, respectively, by epoxy or resin. Ferroelectric elements 1414a and 1414b are bonded to ferroelectric elements 1412a and 1412b, respectively, by epoxy or resin.

Figure 16A:
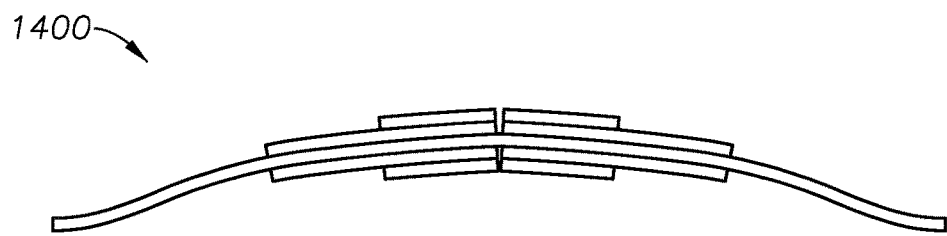
FIGS. 16A, 16B, and 16C illustrate the three symmetric mode of a stacked bender bar illustrated in FIG. 15.
Figure 16B:
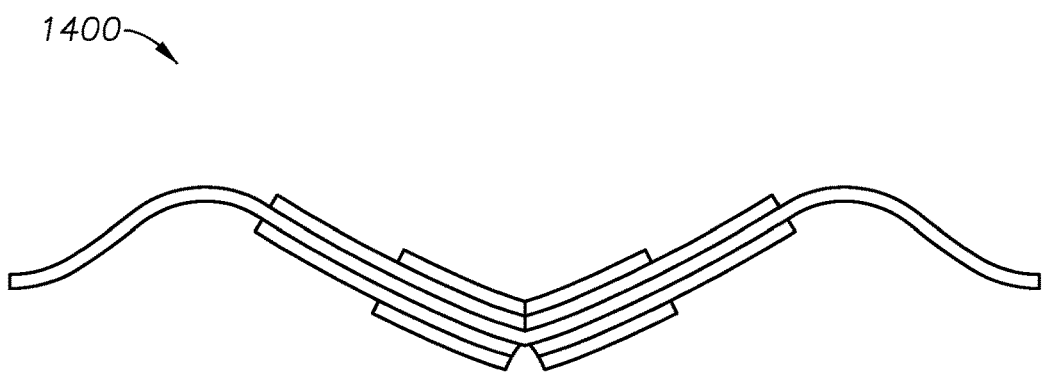
Figure 16C:
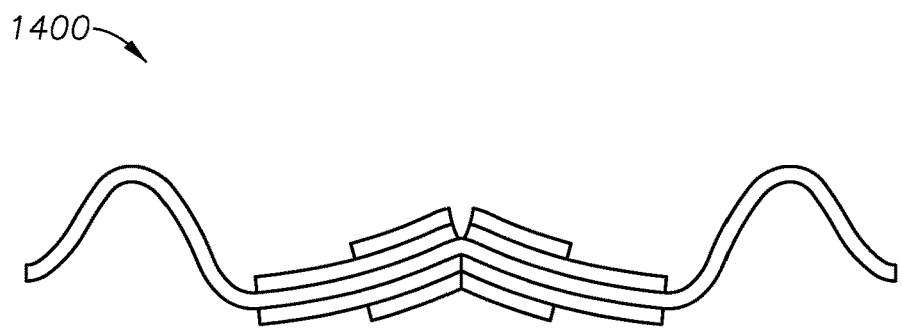
Figure 17:
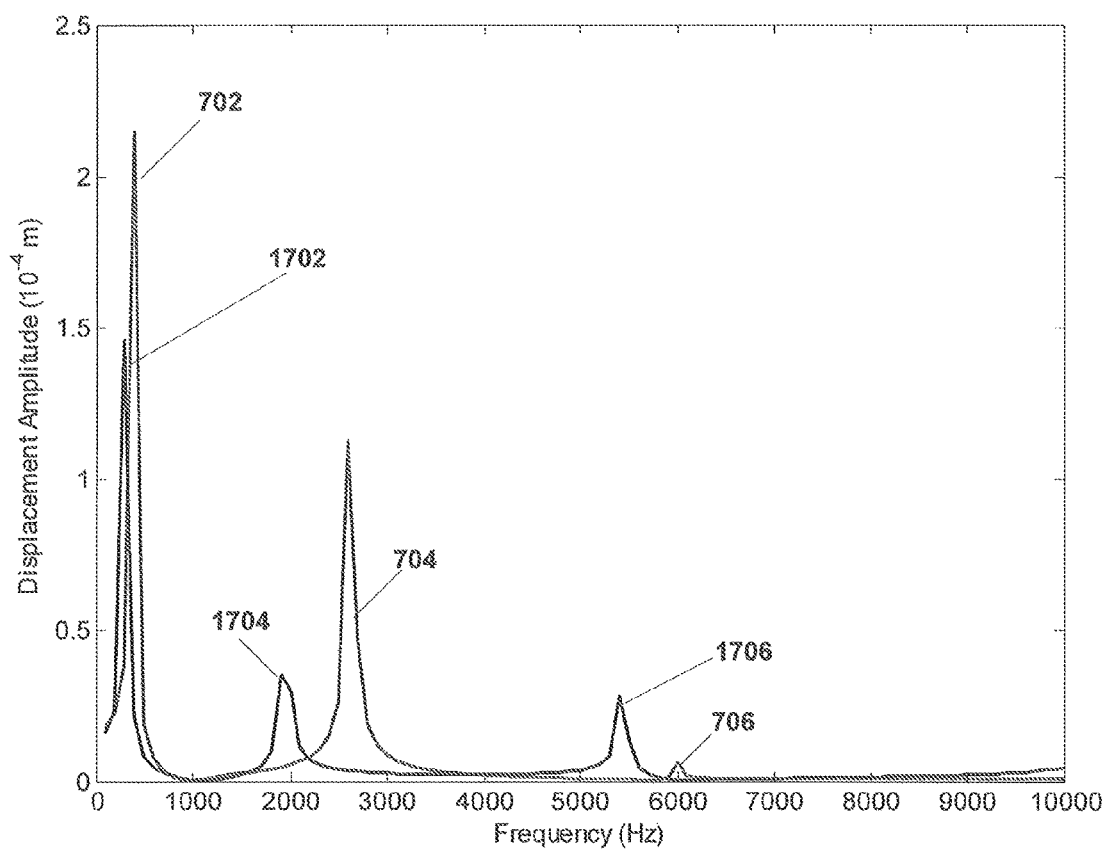
FIG. 17 illustrates a comparison of the harmonic displacement in the Z direction of the bender bar illustrated in FIG. 15 with that of the bender bar illustrated in FIG. 5.

The results of the calculation on bender bar 1400 as illustrated in FIG. 15 (e.g., a stacked and split bender bar) are shown in Table 4. Illustrates of the first three symmetric modes, modes 1, 5, and 8, are illustrated in FIGS. 16A, 16B, and 16C, respectively. FIG. 17 illustrates a comparison of the frequencies of modes 1, 5, and 8 of bender bar 1400 with those of bender bar 100 as illustrated in FIG. 5. As shown in FIG. 17, mode 1 at 321.08 Hz is illustrated as peak 1702, mode 5 at 2013.6 Hz is illustrated as peak 1704, and mode 8 at 5500.7 Hz is illustrated as peak 1706.

TABLE 4

| No. | 1 | 2 | 3 | 4 | 5 | 6 | 7 |
|---|---|---|---|---|---|---|---|
| Freq (Hz) | 321.08 | 860.71 | 942.09 | 1527.0 | 2013.6 | 4526.3 | 4862.2 |
| No. | 8 | 9 | 10 | 11 | 12 | 13 | 14 |
| Freq (Hz) | 5500.7 | 5549.3 | 5765.5 | 6741.5 | 8305.7 | 8670.3 | 8984.4 |

Figure 18:
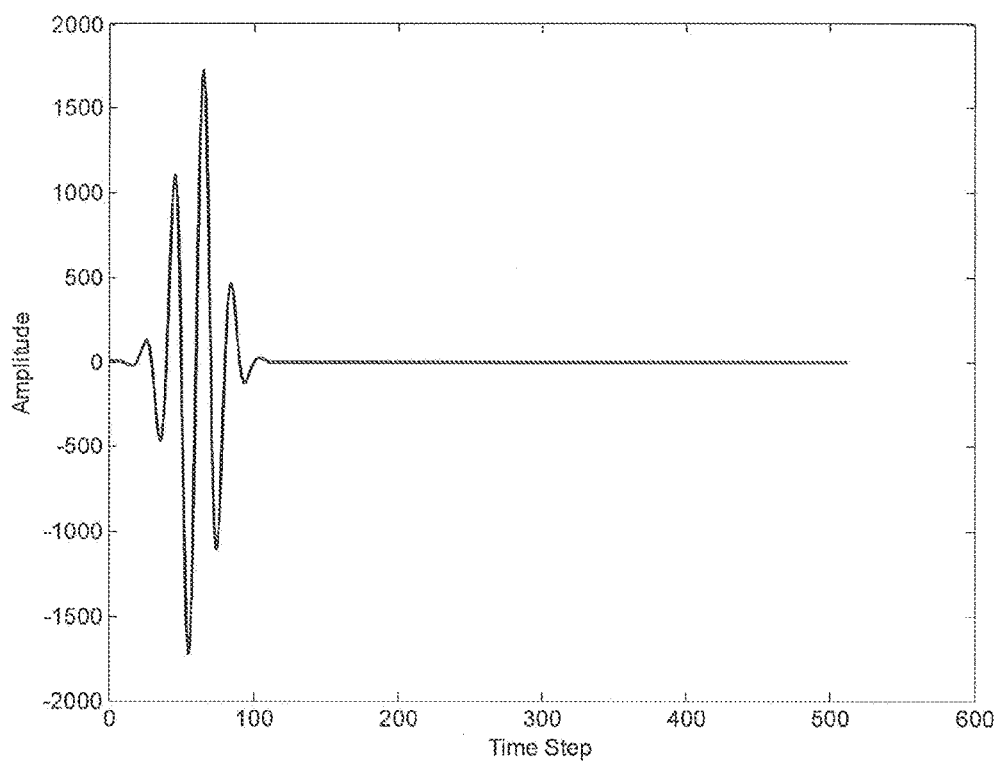
FIG. 18 illustrates a narrow band pulse for driving the PZT elements.

FIG. 18 illustrates a narrow band pulse for driving ferroelectric elements with different center frequency. The main objective is to study the displacement of the mid-point of the bender element. Note that, since there is no loading of the system, the response would be dominated by the harmonic displacements as described in static models discussed above. To show the effects of the multiple driving pulse shapes in different PZT type ferroelectric elements, we use 1000 Hz and 750 Hz narrow pulses with different voltages applied to the stacked elements. The results are shown in the FIG. 19. As such, the illustrative waveform illustrated in FIG. 18 was applied to the ferroelectric elements of the bender bars in the above identified calculations.

Figure 19:
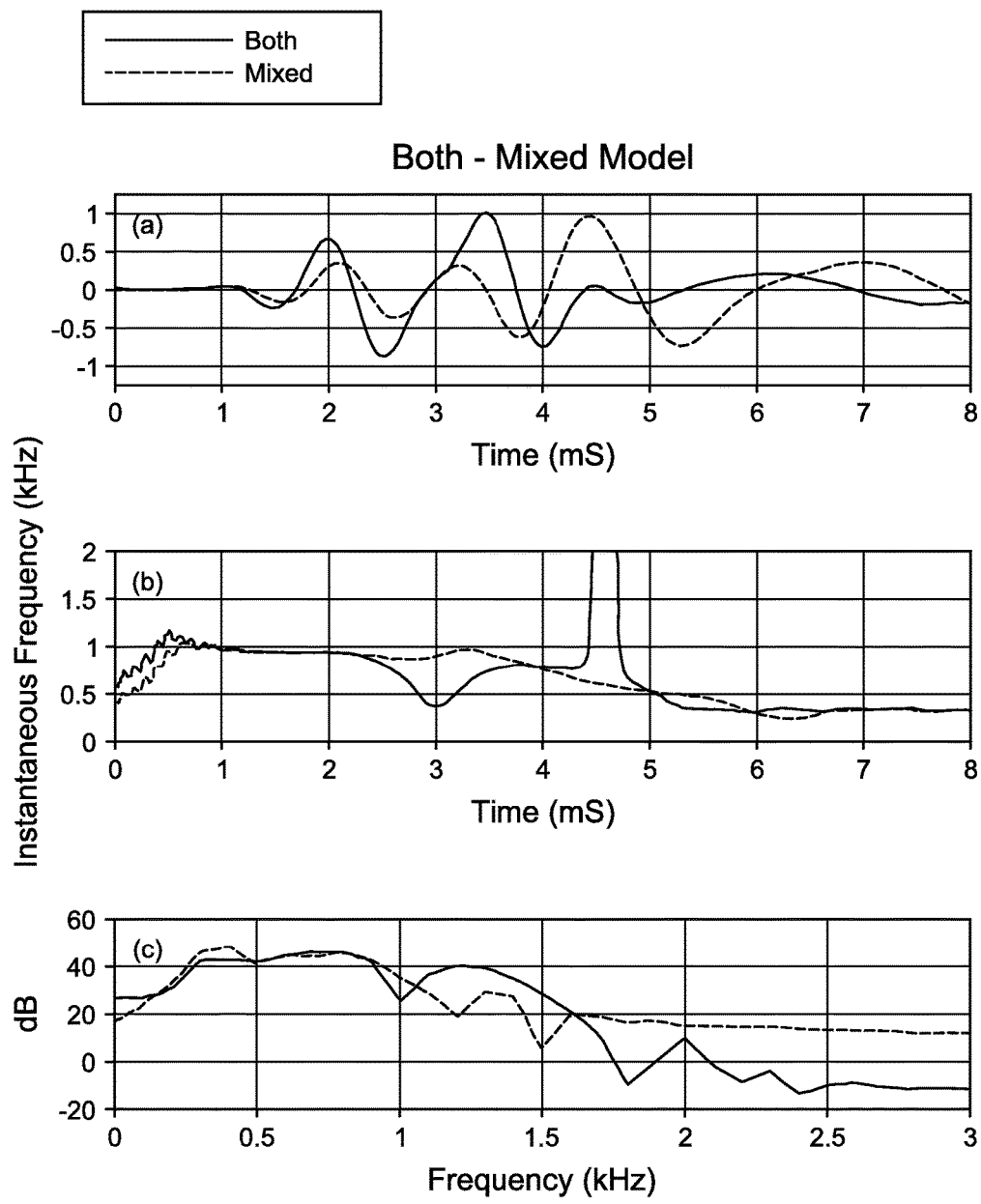
FIG. 19 illustrates the effects of the multiple driving pulse shapes in different PZT elements.

FIG. 19 illustrates dynamic modeling results between driving stacked element with the same driving pulses 1902 with 1000 Hz center frequency and different driving pulses 1904 (1000 Hz pulse applied to the longer PZT element and 750 Hz to the shorter PZT element of bender bar 200 of FIG. 8). As shown in FIG. 19, plot (a) indicates a Time response, plot (b) indicates the Instantaneous frequency (note that there is a spike in the instantaneous frequency for the same driving pulse), and plot (c) indicates the frequency response.

The results indicated in FIG. 19 show that the two different driving pulse shapes change the output responses. Note that these results are used only for two stacked elements. Multiple elements with different driving pulses could produce even better preferred responses. In summary, the controlled driving voltages and pulse shapes with multiple PZT elements could provide a desired response that is proposed in this disclosure.

Figure 20:
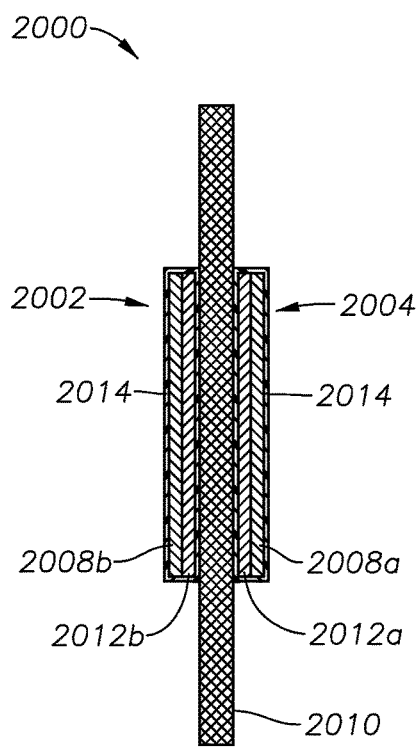
FIGS. 20 and 21 illustrate alternative embodiments of an encapsulated stacked bender bar according to certain illustrative embodiments of the present disclosure.

FIG. 20 illustrates yet another illustrative embodiment of the present disclosure wherein the bender bar includes stacked encapsulated ferroelectric elements utilized to produce and detect acoustic forces (dipole, for example) along a wellbore. Bender bar transducer 2000 includes an inert element 2010, as previously described herein. First and second encapsulated ferroelectric elements 2002 and 2004, respectively, are mounted on each side of inert element 2010 to form a stacked encapsulated bender bar. However, in other embodiments, first and second encapsulated ferroelectric elements 2002,2004 may only be mounted on one side of inert element 2010.

Inert element 2010 may be, for example, aluminum or some other suitable non-piezoelectric element. In certain embodiments, inert element 2010 is a plate having a length, width and thickness, the plate being attached on two or more sides. In others, inert element 2010 is a beam attached at one or both ends. The inert element provides a structure to which the encapsulated active elements 2002, 2004 are bonded. The different attachment techniques provide different levels of coupling with the surrounding fluid. If the beam is attached on all of its sides, then the beam will be stiffer and better suited towards a surrounding fluid with a high bulk modulus. If the inert element 2010 is a cantilevered beam, then the bender bar transducer would have higher deflections and lower forces (aka, lower stiffness) than when the inert element 2010 is a plate attached on two or more sides. The lower stiffness bender bar transducer would be better suited towards operating when the surrounding fluid has a low bulk modulus, such as gas.

First and second encapsulated ferroelectric elements 2002,2004 each include ferroelectric layers 2008a,b and 2012a,b stacked atop one another. Ferroelectric layers 2008, 2012 are encapsulated by material 2014 which may be, for example, a polymer. Material 2014 applies a compressive force to ferroelectric layers 2008,2012 along the length or width of the layers. In certain embodiments, the thickness of material 2014 may be, for example, 0.005 inches to 0.020 inches. In some cases, the compressive stress may be 25 MPa at room temperature. In other applications, the compressive stress may be 50 MPa at the operating temperature. In all cases, it is desired for the compressive stress to be less than 400 MPa in order to avoid compressive failure of the piezoceramic. In addition to this planar compressive force, a tri-axial compressive force may also be applied to layers 2008,2012 by material 201. Once encapsulated, first and second encapsulated ferroelectric elements 2002,2004 are coupled to inert element 2010 using a variety of methods, such as, for example, a two-part epoxy.

The use of material 2014 provides a pre-compression to ferroelectric layers 2008,2012, thus making bender bar transducer 2000 more robust. As a result, first and second encapsulated ferroelectric elements 2002,2004 can handle more bending strain without breaking layers 2008,2012. In addition, encapsulation of layers 2008,2012 make them easier to handle and easier to attach electrical connections thereto. The encapsulation also allows for load transfer in instances when layers 2008,2012 are fractured during use. Moreover, the encapsulation also minimizes electrical arching around the edges of layers 2008,2012.

The illustrative transducers described herein may be manufactured in a variety of ways. In one method, for example, the inert elements and the encapsulated ferroelectric elements have different coefficients of thermal expansion. In such cases, both elements may be heated. After heating, the inert element and encapsulated ferroelectric elements are coupled to one another, and then allowed to cool thereafter. Because they have different amounts of thermal expansion, a compression will occur, as previously described.

The use of multilayered, encapsulated ferroelectric elements as described herein provides a high force output with low voltage requirements. The free-strain output from a piezoelectric ceramic, for example, is proportional to:

$$\varepsilon = d31 \cdot (V/t) \cdot n,$$ Eq. (2), where $\varepsilon$ is the free-strain, $d31$ is the piezoelectric coefficient for the ceramic, V is the applied voltage, t is the thickness of the piezoceramic layer, and n is the number of piezoelectric ceramic layers. Based upon this, we also see that that more layers will produce more displacement. When the movement of the piezoceramic is blocked by being bonded to a substantially stiffer structure, the force imparted by the piezoceramic is shown by:

$$F = E\varepsilon A$$ Eq. (3), where F is the blocked force, E is the modulus, $\varepsilon$ is the free strain, and A is the cross-sectional area. Thus:

$$F = E(d_{31}(V/t))(t \cdot n)w$$ Eq. (4), where w is the width of the piezoceramic, $$F = d_{31}Vn(Ew)$$ Eq. (5), when the constants E and w are removed, $$F = \alpha d_{31}Vn$$ Eq. (6), By removing the constants, we see that it is linearly proportional to these variables. which means that more layers will produce more force and that the thickness of the layers is less important. Therefore, if the applied voltage is kept constant, a greater force can be applied by having more layers of ferroelectric ceramic, n>1. The tradeoff for more layers is that the applied current will also increase, but this is typically not a limiting factor in logging instruments using bender-bars for acoustic logging.

The applied voltage in acoustic logging instruments is often limited by the electronic components that can be used in wellbore environmental conditions, such as the electrical feed-through connectors. Higher voltages need more insulation and thus intrinsically, larger diameter electrical feed-through connectors. Higher applied voltages also need higher-voltage, supply electronics, which is often difficult to design for the higher operating temperatures within a wellbore. Typically, required current for bender bars for acoustic logging has been less of a design limitation than voltage with wellbore logging instruments. Therefore, the use of multi-layer ferroelectric ceramic actuators in the present disclosure is an improvement over traditional bars because we can achieve a higher force output with lower voltage.

Figure 21:
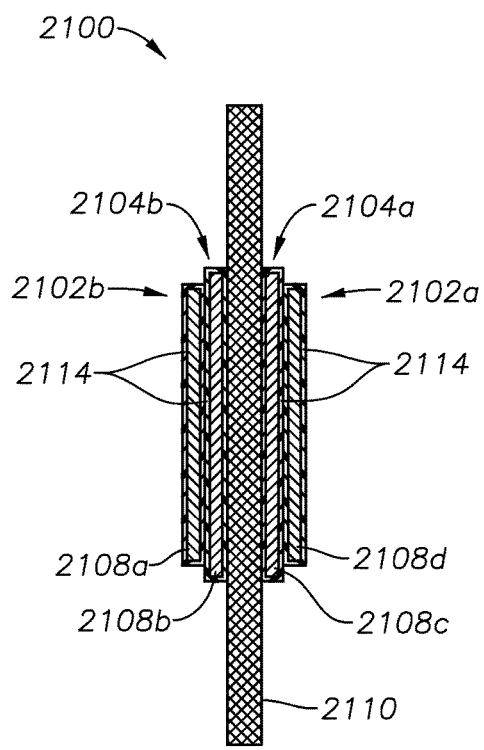

FIG. 21 illustrates another illustrative embodiment of the present disclosure wherein the bender bar includes a plurality of single-layered encapsulated ferroelectric elements. Bender bar 2100 is somewhat similar to bender bar 2000 described with reference to FIG. 20 and, therefore, may be best understood with reference thereto. Bender bar transducer 2100 includes an inert element 2110, as previously described herein. Unlike bender bar 2000, however, bender bar 2100 includes a plurality of single-layered encapsulated ferroelectric elements stacked atop one another. First and second encapsulated ferroelectric elements 2102a,b and 2104a,b, respectively, are mounted on each side of inert element 2110 to form a stacked encapsulated bender bar. However, in other embodiments, first and second encapsulated ferroelectric elements 2102,2104 may only be mounted on one side of inert element 2110.

First and second encapsulated ferroelectric elements 2102,2104 include a single ferroelectric layer 2108a-d. Although described here as ferroelectric elements, other solid state transducers could also be utilized, such as, for example, ferroelectrics and relaxor ferroelectrics, including piezoceramics, piezopolymers, electrostrictors, shape memory ceramics, magnetostrictors, etc., as will be understood by those ordinarily skilled in the art having the benefit of this disclosure. Ferroelectric layers 2108a-d are each encapsulated by material 2114 which may be, for example, a polymer. Material 2114 applies a compressive force to ferroelectric layers 2108,2112 along the length or width of the layers. In certain embodiments, the thickness of material 2014 may be, for example, 0.005 inches to 0.020 inches. In addition to this compressive force, a hydrostatic force may also be applied to layers 2108,2112 by material 2014, all as previously described. Once encapsulated, first and second encapsulated ferroelectric elements 2102,2104 are coupled to inert element 2010 using a variety of methods, such as, for example, glue.

The stacked encapsulation of the embodiments of FIGS. 20 and 21 may be combined with the other features described herein. For example, the bender bar transducer 200 of FIGS. 2A-2D and 3 may include one or more encapsulated ferroelectric layers 202. Layers 202 may be encapsulated individually or two or more layers 202 may be jointly encapsulated. The encapsulation may also be applied to shaped the ferroelectric layers 202 shown in FIGS. 2C and 2D. In another example, bender bar transducer 1100 of FIGS. 11A and 11B may include encapsulated ferroelectric elements 1104. In yet another example, bender bar transducer 1400 if FIGS. 14A and 14B may also include one or more encapsulated ferroelectric elements. In such embodiments, gaps 1420a,b would still be present, as the encapsulation material would only cover the ferroelectric elements on either side of the gaps. In other words, for example, element 1418a would be encapsulated alone or in conjunction with layer 1416a. However, element 1418a would not be encapsulated with element 1408a, thus maintaining gaps 1420a,b. Furthermore, one or more of the shaped ferroelectric layers of FIGS. 14C and 14D may also be encapsulated as previously described.

In addition, the bender bars described herein may be utilized in a variety of environments, including, for example, downhole well applications. As a result, acoustic forces (dipole, for example) may be produced and/or detected through drilling, production, completion, or other downhole fluids.

Moreover, the concept of multilayer encapsulated piezoceramics described herein, which may be utilized on one or both sides of a rounded substrate, are useful in creating a more versatile Piezo-Disc Bender. Commonly referred to as a bimorph or a unimorph transducers, possible applications for a such a Piezo-Disc Bender created with multilayer encapsulated piezoceramics include buzzers, alarms, and speakers in appliance, electronics, and toys, as well as, transmitter and/or receivers used in downhole logging tools or telemetry systems. As described herein, the term transducer refers to a device that may work as either a transmitter or receiver, or as both a transmitter and receiver.

Figure 22A:
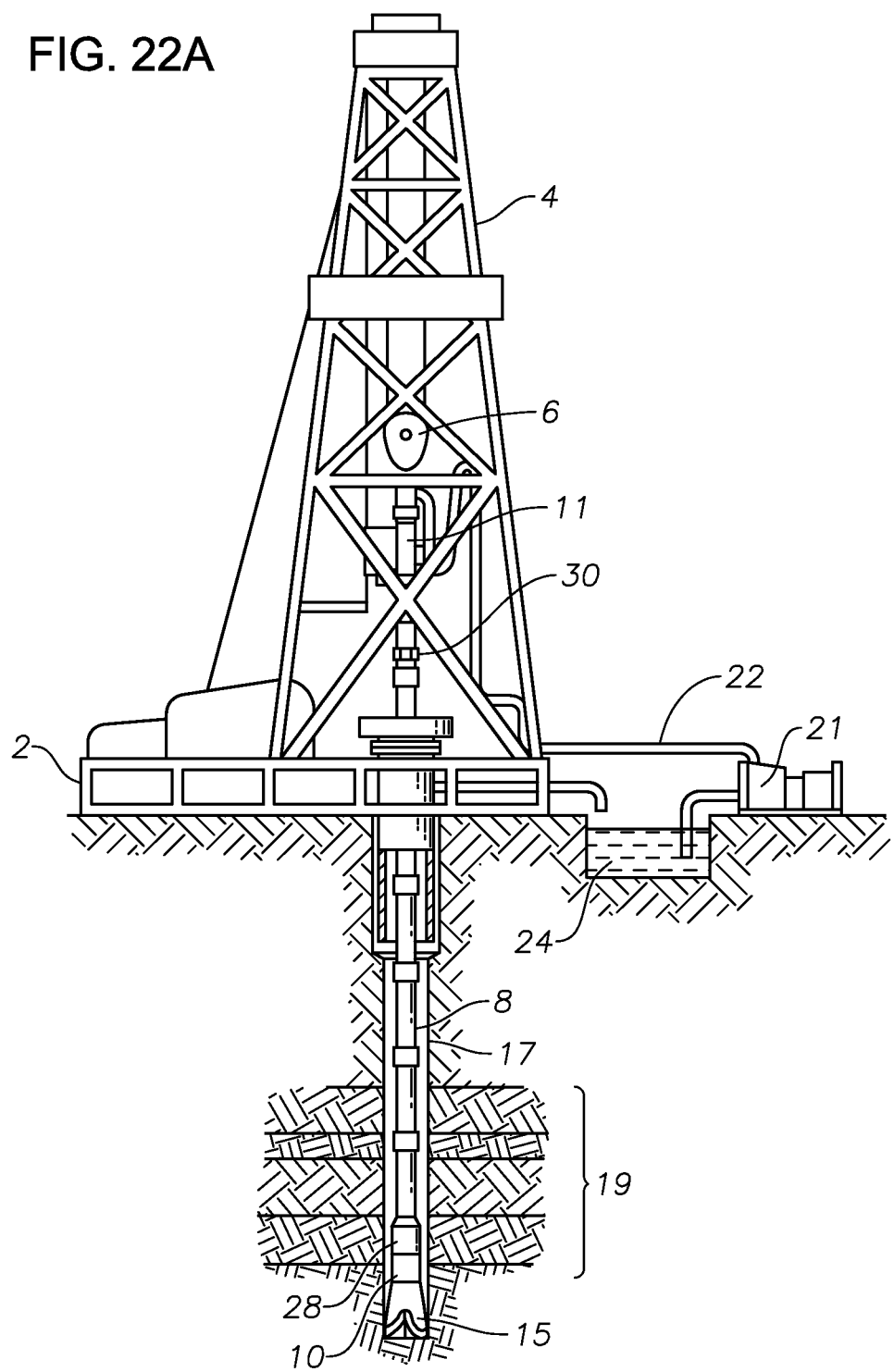
FIGS. 22A-B illustrate acoustic transducers utilized in a drilling and wireline application, respectively, according to illustrative embodiments of the present disclosure.
Figure 22B:
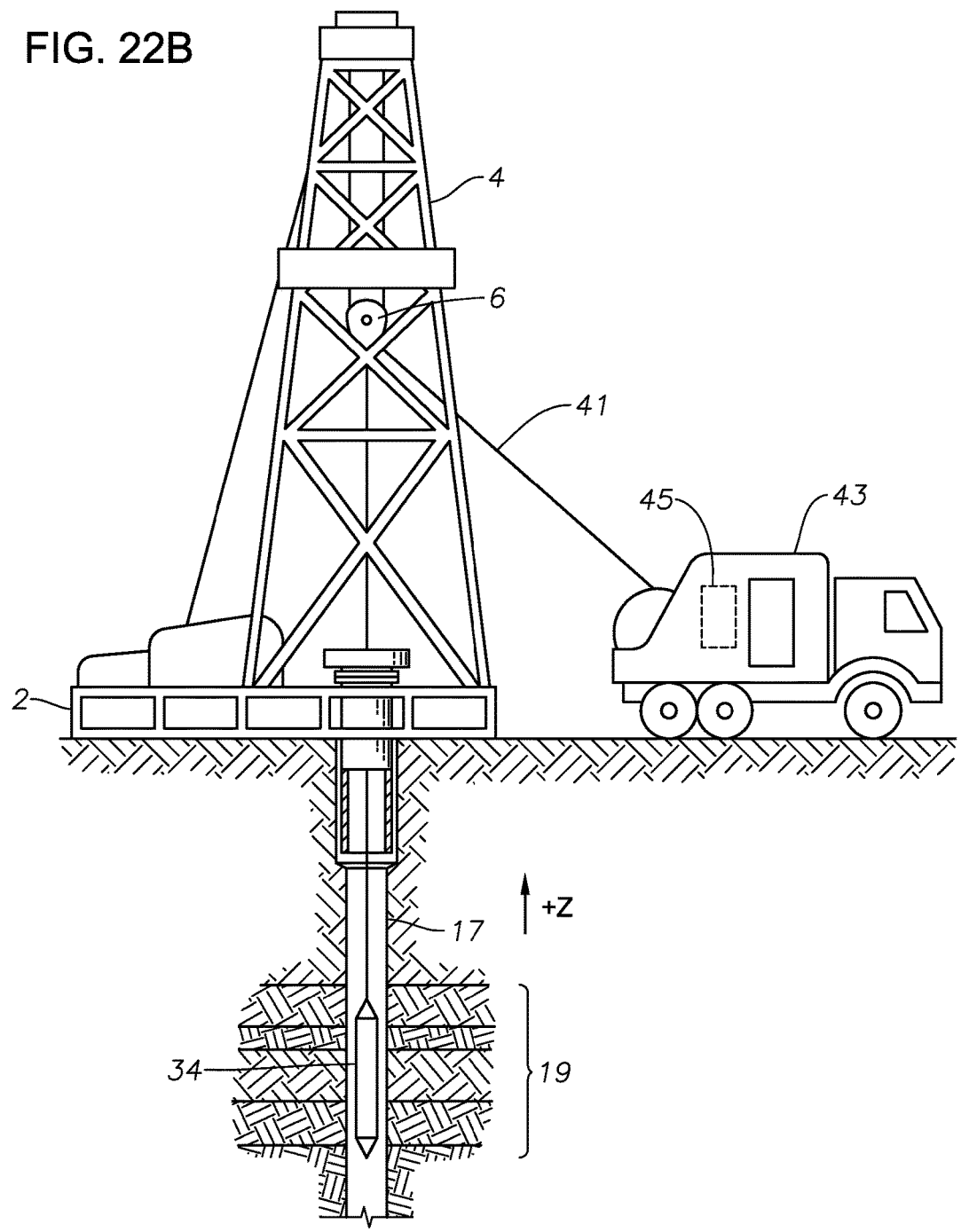

FIGS. 22A-B illustrate acoustic transducers utilized in a drilling and wireline application, respectively, according to illustrative embodiments of the present disclosure. FIG. 22A illustrates a drilling platform 2 equipped with a derrick 4 that supports a hoist 6 for raising and lowering a drill string 8 through various formations 19. Hoist 6 suspends a top drive 11 suitable for rotating drill string 8 and lowering it through well head 13. Connected to the lower end of drill string 8 is a drill bit 15. As drill bit 15 rotates, it creates a wellbore 17 that passes through various formations 19. A pump 21 circulates drilling fluid through a supply pipe 22 to top drive 11, down through the interior of drill string 8, through orifices in drill bit 15, back to the surface via the annulus around drill string 8, and into a retention pit 24. The drilling fluid transports cuttings from the borehole into pit 24 and aids in maintaining the integrity of wellbore 16. Various materials can be used for drilling fluid, including, but not limited to, a salt-water based conductive mud.

An acoustic logging tool 10 is integrated into the bottom-hole assembly near the bit 15. In this illustrative embodiment, logging tool 10 is an LWD tool utilizing a bender bar acoustic transducer as described herein; however, in other illustrative embodiments, logging tool 10 may be utilized in a wireline or tubing-convey logging application. Moreover, in certain illustrative embodiments, logging tool 10 may be adapted to perform logging operations in both open and cased hole environments.

Still referring to FIG. 22A, as drill bit 15 extends wellbore 17 through formations 19, logging tool 10 collects acoustic measurement signals relating to various formation properties, as well as the tool orientation and various other drilling conditions. In certain embodiments, logging tool 10 may take the form of a drill collar, i.e., a thick-walled tubular that provides weight and rigidity to aid the drilling process. A telemetry sub 28 may be included to transfer images and measurement data/signals to a surface receiver 30 and to receive commands from the surface. In some embodiments, telemetry sub 28 does not communicate with the surface, but rather stores logging data for later retrieval at the surface when the logging assembly is recovered.

Still referring to FIG. 22A, logging tool 10 includes a system control center ("SCC"), along with necessary processing/storage/communication circuitry, that is communicably coupled to one or more acoustic transmitters and/or receivers (not shown) utilized to acquire formation measurement signals reflecting formation parameters. In certain embodiments, once the measurement signals are acquired, the SCC calibrates the measurement signals and communicates the data back uphole and/or to other assembly components via telemetry sub 28. In an alternate embodiment, the system control center may be located at a remote location away from logging tool 10, such as the surface or in a different borehole, and performs the processing accordingly. These and other variations within the present disclosure will be readily apparent to those ordinarily skilled in the art having the benefit of this disclosure.

FIG. 22B illustrates an alternative embodiment of the present invention whereby an acoustic transducer is utilized in a wireline application. At various times during the drilling process, drill string 8 may be removed from the borehole as shown in FIG. 24B. Once drill string 8 has been removed, logging operations can be conducted using a wireline logging sonde 34, i.e., a probe suspended by a cable 41 having conductors for transporting power to the sonde 34 and telemetry from sonde 34 to the surface. The wireline logging sonde 34 includes the acoustic logging tool 10 as described herein to transmit and/or receiver acoustic forces. A logging facility 43 collects measurements from the logging sonde 34, and includes a computer system 45 for processing and storing the measurements gathered by the transmitter/receivers.

Through use of the illustrative embodiments of the present disclosure, bender bars are improved in a number of ways. First, for example, a larger acoustic output (increased pressure) is provided. Second, since lower voltages are needed, smaller electrical and feed-through connectors may be utilized. Third, an acoustic output with a wider frequency band (i.e., broadband signal) may be produced. As a result, the bender bar has a broader frequency response which allows for sweeping of the entire acoustic transmission frequency. Fourth, a more consistent acoustic output is provided, all while maintaining a high modal purity (large dipole/monopole & dipole/quadrupole ratios, for example).

Embodiments described herein further relate to any one or more of the following paragraphs:

1. An acoustic transducer for use in a wellbore, the transducer comprising: an inert element; and a first encapsulated ferroelectric element coupled to the inert element, the first encapsulated ferroelectric element having two or more layers stacked atop one another, wherein the first encapsulated ferroelectric element produces and detects acoustic forces along the wellbore.

2. A transducer as defined in paragraph 1, wherein the inert element comprises: a plate having a first side, a second side opposite the first side, and a first and second end; and a beam attached at the first end, the second end, or both.

3. A transducer as defined in any of paragraphs 1 or 2, wherein the first encapsulated ferroelectric element is coupled to the first side of the plate, the transducer further comprising a second encapsulated ferroelectric element coupled to the second side of the plate, the second encapsulated ferroelectric element also having two or more layers stacked atop one another.

4. A transducer as defined in any of paragraphs 1 to 3, wherein a material utilized to encapsulate the first encapsulated ferroelectric element applies a compressive force to the stacked layers.

5. A transducer as defined in any of paragraphs 1 to 4, wherein the compressive force comprises at least one of a compressive force along a length of the first encapsulated ferroelectric element; a compressive force along a width of the first encapsulated ferroelectric element; and a tri-axial compressive force applied to the first encapsulated ferroelectric element.

6. A transducer as defined in any of paragraphs 1 to 5, wherein a material utilized to encapsulate the first encapsulated ferroelectric element comprises a polymer.

7. A transducer as defined in any of paragraphs 1 to 6, wherein the wellbore contains drilling, production or completion fluid.

8. A transducer as defined in any one of paragraphs 1 to 7, wherein the acoustic forces are dipole acoustic forces.

9. A transducer as defined in any one of paragraphs 1 to 8, wherein the transducer is part of an acoustic logging tool or acoustic telemetry system.

10. A method for manufacturing an acoustic transducer for use in a wellbore, the method comprising: providing an inert element; and coupling a first encapsulated ferroelectric element to the inert element, the first encapsulated ferroelectric element having two or more layers stacked atop one another, wherein the first encapsulated ferroelectric element produces and detects dipole acoustic forces along the wellbore.

11. A method as defined in paragraph 10, wherein providing the inert element further comprises providing the inert element as: a plate having a first side, a second side opposite the first side, and a first and second end; a beam attached at both ends; or a beam attached at one end.

12. A method as defined in any of paragraphs 10 or 11, wherein the first encapsulated ferroelectric element is coupled to the first side of the plate, the method further comprising coupling a second encapsulated ferroelectric element to the second side of the plate, the second encapsulated ferroelectric element also having two or more layers stacked atop one another.

13. A method as defined in any one of paragraphs 10 to 12, wherein coupling the first encapsulated ferroelectric element further comprises compressing the first encapsulated ferroelectric element.

14. A method as defined in any of paragraphs 10 to 13, wherein the inert element and the first encapsulated ferroelectric element have different coefficients of thermal expansion; and compressing the first encapsulated ferroelectric element comprises: heating the inert element and the first encapsulated ferroelectric; coupling the first encapsulated ferroelectric element to the inert element; and after the coupling, cooling the inert element and the first encapsulated ferroelectric element.

15. A method as defined in any of paragraphs 10 to 14, wherein compressing the first encapsulated ferroelectric elements further comprises at least one of: applying a compressive force along a length of the first encapsulated ferroelectric element; applying a compressive force along a width of the first encapsulated ferroelectric element; and applying a tri-axial compressive force to the first encapsulated ferroelectric element.

16. A method utilizing an acoustic transducer within a wellbore, the method comprising: deploying the transducer into the wellbore, the transducer comprising an inert element; and an encapsulated ferroelectric element coupled to the inert element, the encapsulated ferroelectric element having two or more layers stacked atop one another; and producing an acoustic force along the wellbore utilizing the first encapsulated ferroelectric element and the inert element.

17. A method as defined in paragraph 16, wherein producing the acoustic force further comprises producing a dipole acoustic force.

18. A method as defined in any of paragraphs 16 or 17, wherein a material utilized to encapsulate the encapsulated ferroelectric element applies a compressive force to the stacked layers.

19. A method as defined in any of paragraphs 16 to 18, wherein producing the acoustic force along the wellbore further comprises producing the acoustic force through a drilling or completion fluid.

20. A method as defined in any of paragraphs 16-19, wherein the transducer is deployed along a wireline or as part of a logging-while-drilling or measurement-while drilling assembly.

21. An acoustic transducer for use in a wellbore, the transducer comprising: an inert element; a first encapsulated ferroelectric element coupled to the inert element, the first encapsulated ferroelectric element having a single layer; and a second encapsulated ferroelectric element stacked atop the first encapsulated ferroelectric element, the second encapsulated ferroelectric element having a single layer, wherein the first and second encapsulated ferroelectric elements produce and detect acoustic forces along the wellbore.

22. A transducer as defined in paragraph 21, wherein the inert element comprises: a plate having a first side, a second side opposite the first side, and a first and second end; a beam attached at both ends; or a beam attached at one end.

23. A transducer as defined in any of paragraphs 21 or 22, wherein a material utilized to encapsulate the first and second encapsulated ferroelectric elements applies a compressive force to the layers.

24. A transducer as defined in any of paragraphs 21 to 23, wherein the wellbore contains drilling, production or completion fluid.

25. A transducer as defined in any of paragraphs 21 to 24, wherein the acoustic forces are dipole acoustic forces.

Although various embodiments and methodologies have been shown and described, the disclosure is not limited to such embodiments and methodologies and will be understood to is include all modifications and variations as would be apparent to one skilled in the art. For example, in addition to logging tools, the acoustic transducers described herein may also be utilized in acoustic telemetry systems. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. An acoustic transducer for use in a wellbore, the transducer comprising:
an inert element comprising:
a plate having a first side, a second side opposite the first side, and a first and second end; and
a beam attached at the first end, the second end, or both;
a first encapsulated ferroelectric element directly bonded to the inert element, the first encapsulated ferroelectric element having two or more layers stacked atop one another, wherein the first encapsulated ferroelectric element is directly bonded to the first side of the plate, wherein a material utilized to encapsulate the first encapsulated ferroelectric element applies a compressive force to the stacked layers; and a second encapsulated ferroelectric element directly bonded to the second side of the plate, the second encapsulated ferroelectric element also having two or more layers stacked atop one another, wherein the acoustic transducer produces and detects acoustic forces along the wellbore.

2. A transducer as defined in claim 1, wherein the compressive force comprises at least one of:
a compressive force along a length of the first encapsulated ferroelectric element;
a compressive force along a width of the first encapsulated ferroelectric element; and
a tri-axial compressive force applied to the first encapsulated ferroelectric element.

3. A transducer as defined in claim 1, wherein the material utilized to encapsulate the first encapsulated ferroelectric element comprises a polymer.

4. A transducer as defined in claim 1, wherein the wellbore contains drilling, production or completion fluid.

5. A transducer as defined in claim 1, wherein the acoustic forces are dipole acoustic forces.

6. A transducer as defined in claim 1, wherein the transducer is part of an acoustic logging tool or acoustic telemetry system.

7. A transducer as defined in claim 1, wherein the compressive force applied to the stacked layers is 25-400 MPa.

8. A method for manufacturing an acoustic transducer for use in a wellbore, the method comprising:
providing an inert element comprising:
a plate having a first side, a second side opposite the first side, and a first and second end; and
a beam attached at the first end, the second end, or both;
directly bonding a first encapsulated ferroelectric element to the first side of the inert element, the first encapsulated ferroelectric element having two or more layers stacked atop one another, wherein a material utilized to encapsulate the first encapsulated ferroelectric element applies a compressive force to the stacked layers; and
directly bonding a second encapsulated ferroelectric element to the second side of the plate, the second encapsulated ferroelectric element also having two or more layers stacked atop one another, wherein the acoustic transducer produces and detects dipole acoustic forces along the wellbore.

9. A method as defined in claim 8, wherein coupling the first encapsulated ferroelectric element further comprises compressing the first encapsulated ferroelectric element.

10. A method as defined in claim 9, wherein:
the inert element and the first encapsulated ferroelectric element have different coefficients of thermal expansion; and
compressing the first encapsulated ferroelectric element comprises:
heating the inert element and the first encapsulated ferroelectric;
after the heating, directly bonding the first encapsulated ferroelectric element to the inert element; and
after the direct bonding, cooling the inert element and the first encapsulated ferroelectric element.

11. A method as defined in claim 9, wherein compressing the first encapsulated ferroelectric elements further comprises at least one of:

applying a compressive force along a length of the first encapsulated ferroelectric element;
applying a compressive force along a width of the first encapsulated ferroelectric element; and
applying a tri-axial compressive force to the first encapsulated ferroelectric element.

12. A method utilizing an acoustic transducer within a wellbore, the method comprising:
deploying the transducer into the wellbore, the transducer comprising:
an inert element;
a first encapsulated ferroelectric element directly bonded to a first side of the inert element, the first encapsulated ferroelectric element having two or more layers stacked atop one another, wherein a material utilized to encapsulate the first encapsulated ferroelectric element applies a compressive force to the stacked layers;
a second encapsulated ferroelectric element directly bonded to a second side of the inert element, the second encapsulated ferroelectric element also having two or more layers stacked atop one another; and
producing an acoustic force along the wellbore utilizing the first and second encapsulated ferroelectric elements and the inert element.

13. A method as defined in claim 12, wherein producing the acoustic force further comprises producing a dipole acoustic force.

14. A method as defined in claim 12 or 13, wherein the material utilized to encapsulate the encapsulated ferroelectric element applies a compressive force to the stacked layers.

15. A method as defined in claim 12 or 13, wherein producing the acoustic force along the wellbore further comprises producing the acoustic force through a drilling or completion fluid.

16. A method as defined in claim 12, wherein the transducer is deployed along a wireline or as part of a logging-while-drilling or measurement-while drilling assembly.

17. An acoustic transducer for use in a wellbore, the transducer comprising:
an inert element;
a first encapsulated ferroelectric element directly bonded to the inert element, the first encapsulated ferroelectric element having a single layer;
a second encapsulated ferroelectric element stacked directly atop the first encapsulated ferroelectric element, the second encapsulated ferroelectric element having a single layer, wherein the first and second encapsulated ferroelectric elements produce and detect acoustic forces along the wellbore; and
a material utilized to encapsulate the first and second encapsulated ferroelectric elements applies a compressive force to the layers.

18. A transducer as defined in claim 17, wherein the inert element comprises:
a plate having a first side, a second side opposite the first side, and a first and second end;
a beam attached at both ends; or
a beam attached at one end.

19. A transducer as defined in claim 17, wherein the wellbore contains drilling, production or completion fluid.

20. A transducer as defined in claim 17, wherein the acoustic forces are dipole acoustic forces.

* * * * *